United States Patent [19]

Kane

[11] 4,381,566
[45] Apr. 26, 1983

[54] ELECTRONIC TUNING ANTENNA SYSTEM

[75] Inventor: Johji Kane, Sakai, Japan

[73] Assignee: Matsushita Electric Industrial Co., Ltd., Kadoma, Japan

[21] Appl. No.: 158,132

[22] Filed: Jun. 10, 1980

[30] Foreign Application Priority Data

Jun. 14, 1979 [JP] Japan .................................. 54-76245
Jun. 14, 1979 [JP] Japan .................................. 54-76246
Jun. 14, 1979 [JP] Japan .................................. 54-76249
Jun. 14, 1979 [JP] Japan .................................. 54-76251

[51] Int. Cl.³ .......................... H01Q 9/26; H04B 1/18
[52] U.S. Cl. .................................. 455/193; 343/747; 343/806
[58] Field of Search .............. 343/747, 806, 854, 701, 343/802; 455/193, 275, 289

[56] References Cited

U.S. PATENT DOCUMENTS 3,231,894 1/1966 Nagai .................................. 343/806
3,818,480 6/1974 West .................................. 343/861

Primary Examiner—Eli Lieberman
Attorney, Agent, or Firm—Wenderoth, Lind & Ponack

[57] ABSTRACT

At the feed side of each antenna element having transmitting conductor paths formed in continuous meandering shapes and having distributed constant impedances are electrically connected a variable tuning unit including a voltage variable reactance circuit and an impedance adjusting reactance element, thereby constituting an antenna circuit. A voltage variable capacitor is connected within the voltage variable reactance circuit.

Antenna feed terminals are connected through a coaxial cable to input terminals of a remote-set radio receiver. A tuning control signal generated within the radio receiver is fed to a voltage variable capacitor within the voltage variable reactance circuit of the antenna circuit through the coaxial cable. The tuning control signal allows the antenna circuit to resonate with a particular frequency within a frequency band, the freqency being variable. The antenna element having the distributed constant inductance functions so as to have the best possible antenna radiation efficiency at resonant frequency signal by being in combination with the variable tuning unit and the antenna element is considerably reduced in size.

At the resonant frequency signal, the characteristic impedance at the feed terminals of the antenna circuit becomes equal to that impedance at the receiving input terminals at the radio receiver connected to the antenna circuit, whereby an RF signal at the resonant frequency is selected and fed most efficiency to the radio receiver through the coaxial cable.

4 Claims, 60 Drawing Figures

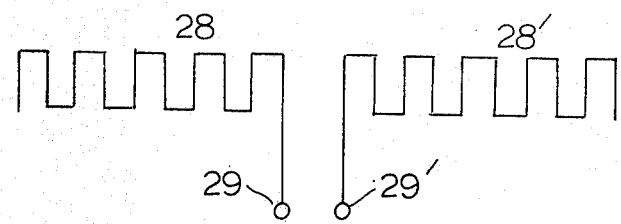
FIG.22
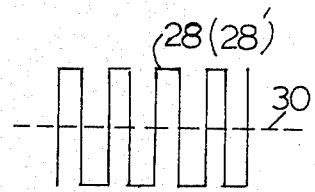 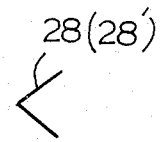
FIG.23a          FIG.23b
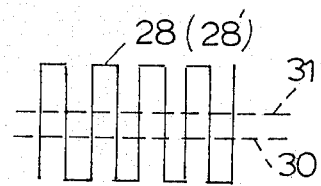 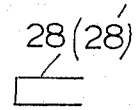
FIG.24a          FIG.24b
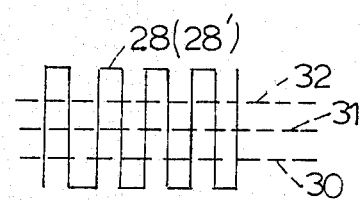 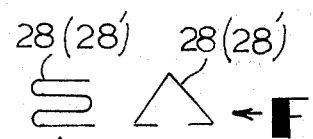
FIG.25a          FIG.25b
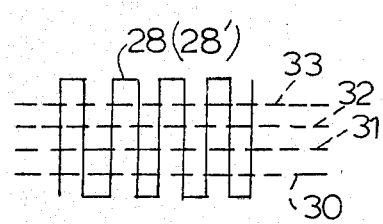 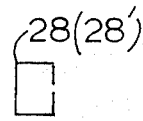
FIG.26a          FIG.26b

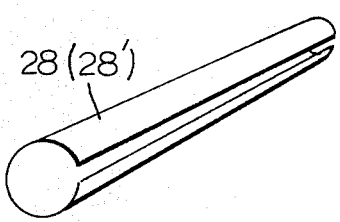
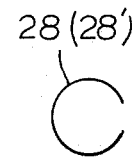
FIG.27a  FIG.27b
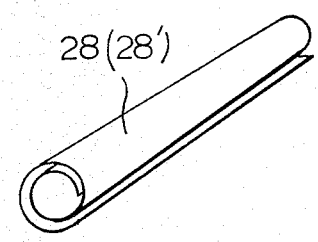
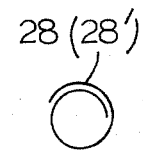
FIG.28a  FIG.28b
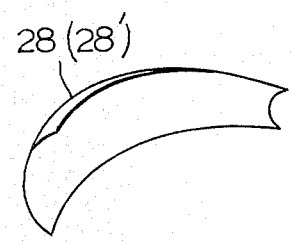
FIG.29a  FIG.29b

ELECTRONIC TUNING ANTENNA SYSTEM

BACKGROUND OF THE INVENTION

At present, a general and the most efficient antenna element is a dipole antenna of a half wave length of the frequency of the signal used for receiving or transmitting. However, a half-wave length dipole antenna for a frequency band below the VHF band is considerably large in size from the viewpoint of practical use.

Such a large-sized antenna is difficult to install and has many problems in maintenance and safety. Therefore, from a viewpoint of further expanding the flexibility in the installation of the antenna, it is also desirable to make the antenna small-sized.

Hitherto, it has been tried or proposed in other fields to make the dipole antenna small-sized, in which antenna gain has been very low in comparison with the half-wave length dipole antenna.

The reason for this is that loading means, which is a technical requirement for contracting the dipole antenna in length, results in a very large loss in radiation power caused by the resistance loss existing in a small-sized dipole antenna which embodies the loading means, thereby considerably reducing the radiation power so as to result in a low radiation efficiency.

Lowering of radiation efficiency, of course, means the lowering of the antenna gain.

Furthermore, even with the aforesaid half-wave length dipole antenna, set values of V.S.W.R. at feed terminals cannot be ideal at all frequency points within the corresponding frequency band, which is due to the fact that the half-wave length dipole antenna of a fixed length has only one frequency resulting in a perfect resonance condition, and has an essential defect that the values at V.S.W.R. are of course deteriorated at other frequencies. The defect causes mismatching in the characteristic impedance between the half-wave dipole antenna and the radio receiver connected thereto. A reflection loss exists in reception signal energy transmission due to the mismatching, thereby lowering the gain of the whole antenna system including the antenna and radio receiver.

From the above, a small-sized antenna is required which has a high gain and ideal values of V.S.W.R. at the characteristic impedance of feed terminals at all frequency points within a corresponding frequency band.

SUMMARY

This invention relates to a transmitting-receiving antenna for receving television signals in the VHF and UHF bands, FM radio signals and other radio communications signals.

An object of the invention is to provide an antenna system which has antenna elements of reduced size, which improves the gain of the reduced antenna itself, which electronically controls the tuning of the reduced size antenna with the radio receiver connected thereto, and which connects the antenna and radio receiver so that the matching of the characteristic impedance therebetween is always in a satisfactory ideal condition, thereby eliminating a loss of receiving signal energy transmission between the antenna and the receiver as much as possible so as to obtain a high gain.

An embodiment of antenna system of the invention is a receiving antenna system for receiving FM radio signals including a remote-set radio receiver. The antenna system is of a turn-back shape comprising continuous transmission conductor paths and has elements at the feeding side of the antenna which have distributed constant inductance and includes a variable tuning unit including a voltage variable reactance and an impedance adjusting reactance element which are electrically connected so as to form an antenna circuit. A voltage variable condenser is connected to the voltage variable reactance. The antenna feed terminals are connected to the input terminals of the remote-set radio receiver through a coaxial cable. A tuning control signal generated within the radio receiver is fed through the coaxial cable to a voltage variable reactance element within the voltage variable reactance circuit of the antenna circuit, the antenna circuit being resonant through the tuning control signal with a particular variable frequency previously set within the frequency band. The antenna elements having distributed constant inductances which are combined with the variable tuning unit to function so as to have the best antenna radiation efficiency. For the resonant frequency signal, the characteristic impedance of the feed terminals at the antenna circuit is equal to that of receiving input terminals at the radio receiver connected to the antenna circuit so that an RF signal of a selected frequency is fed to the radio receiver most effectively through the coaxial cable.

It is possible to constitute the antenna so as to be small-sized and of high gain by use of a distributed constant loading element combined with the tuning unit, and it is possible to provide an antenna system of high gain due to the fact that an ideal matching of the characteristic impedance of the antenna and radio receiver is realized so as to enable the reduction in the transmission loss of receiving signal.

The antenna system of another developed form is arranged such that a frequency signal divided from an oscillation frequency signal generated at a local oscillator within the radio receiver is used as the control signal used for the ganged tuning control of both the antenna and radio receiver, the divided frequency signal being fed to the antenna through the coaxial cable and converted into a tuning control d.c. voltage through a frequency to d.c. voltage converter to thereby generate the tuning control voltage, thus making it possible to obtain more complete tuning control correspondance between the antenna and receiver.

BRIEF DESCRIPTION OF THE DRAWINGS

FIG. 17-b is an enlarged view of the principal portion thereof;

FIG. 22 shows the arrangement of still another antenna element used for the antenna system of the present invention;

FIG. 23-a is an enlarged view of the principal portion thereof;

FIG. 23-b is a sectional view of the shape of the principal portion of the element shown in FIG. 23-a;

FIGS. 24a, b through 26a, b show yet a further example of antenna elements used for the antenna system of the present invention, in which FIGS. 24a-26a are developed views of the antenna element, and FIGS. 24b-26c are sectional views thereof;

FIGS. 27a, b through 29a, b show yet another example of antenna elements used for the antenna system of the present invention, in which FIGS. 27a-29a are perspective views thereof and FIGS. 27b-29b are sectional views of the same element;

DETAILED DESCRIPTION

Generally, when the antenna is small-sized relative to the wave length of the frequency in use, radiation resistance considerably decreases relative to radiation reactance. Hence, radiation efficiency lowers so as to reduce the working gain of the antenna. Therefore, it is difficult to design a small-sized antenna, which, even though small-sized, does not reduce radiation efficiency and, even with an element length nearly as small as a conventional small-sized antenna, has a high working gain. Conventionally, a loading antenna is proposed to effect a small-sized antenna in practice. A conventional contraction type dipole antenna is exemplified in FIGS. 1-a and -b.

Figure 1A:
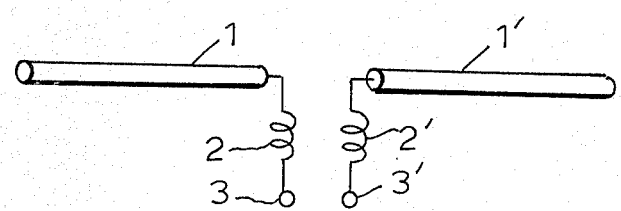
FIGS. 1-a and -b show the arrangement of a conventional contraction type antenna.
Figure 1B:
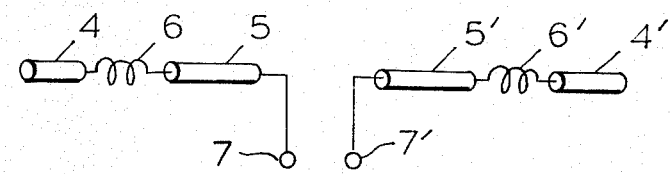

In FIG. 1-a, the dipole antenna has contracted elements, 1, 1' added to coils 2, 2' having reactance components which negate the reactance components of the elements 1, 1' so that the impedance at the feed terminals 3, 3' becomes a desired resistance value at a desired frequency. In FIG. 1-b, coils 6 and 6' have been added between contracted elements 4 and 5 and between elements 4' and 5' and negate the reactance components of these elements so that the impedance at the feed terminals 7, 7' becomes a desired resistance value at a desired frequency. These antenna devices, however, require that a very large reactance to be added to the contracted elements, whereby a loss occurs at each coil which raises a problem and the losses lower the radiation efficiency so as to reduce the working gain of the antenna, thereby making such antennas not practicable.

In order to overcome the aforesaid conventional problems, this invention has been designed. An antenna system of the present invention will be detailed in accordance with the drawings.

Figure 2:
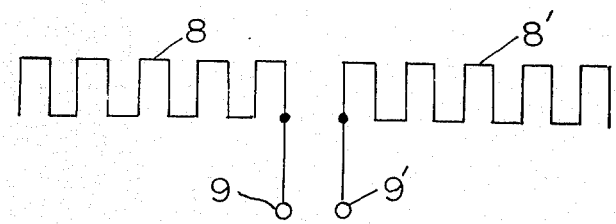
FIG. 2 shows the arrangement of an example of an antenna element used for the antenna system of the present invention.

Referring to FIG. 2, a typical construction of an antenna element used in this invention is shown, in which contracted elements 8 and 8' (hereinafter merely referred to as elments 8, 8') having a distributed constant inductance and which comprise metallic foil or wire, such as copper, aluminum or iron, of a low electrical resistance value, or of a conductive foil on a printed base are bent at a desired number of desired points in desired directions and at desired angles to thereby be formed as shown. The elements 8, 8' are subjected to a distributed constant impedance caused by bending the conductors and by continuously arranging the conductors at the bending points and between each bending point in relation to being distributed mutually lengthwise of and perpendicularly to each element, thereby being equivalent to the conventional elements, as shown in FIGS. 1-a and -b, combined with the loading coils for negating the reactances of the elements. Hence, the use of such elements 8, 8' requires no concentrated constant coils as used conventionally. Furthermore, since the conductors constituting the elements 8, 8' may be fabricated of material of a foil-like or tube-like shape and of a wide surface area, the losses are greatly reduced. Hence, it is possible to solve the problem of the hitherto very large coil losses which thereby lower the radiation efficiency, and it is possible to improve the working gain and to realize a practicable small-sized antenna.

Figure 3:
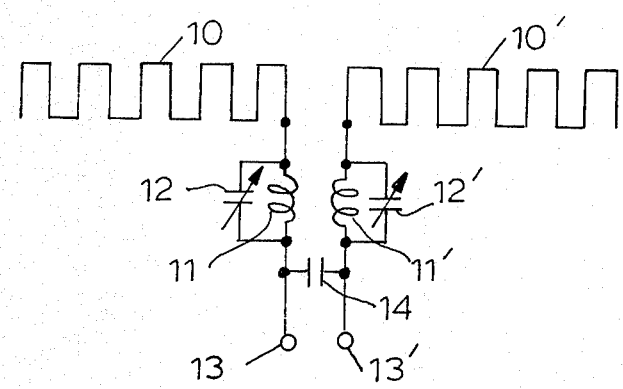
FIG. 3 shows the construction of an embodiment of the antenna system of the invention.
Figure 4:
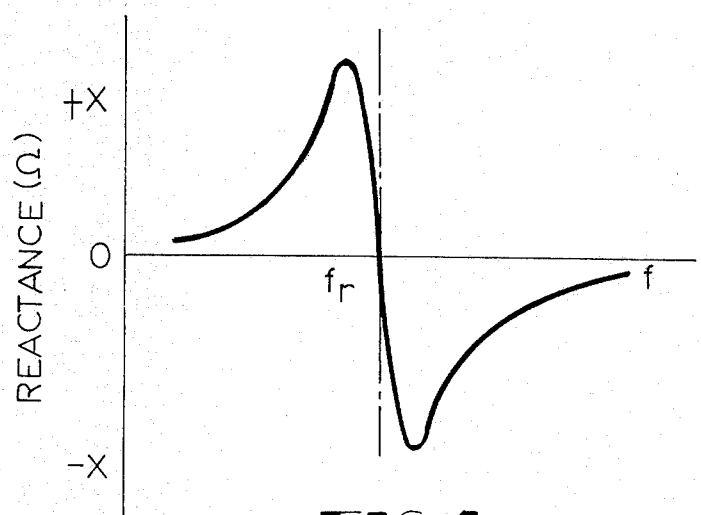
FIG. 4 is a view of the characteristc curve of reactance with respect to frequency of a parallel resonance circuit for tuning control at the same system.
Figure 5:
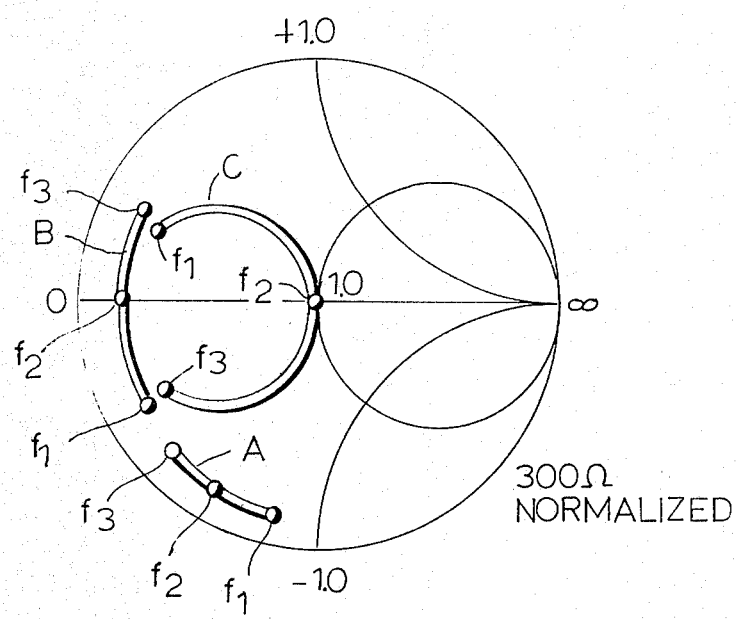
FIG. 5 is a characteristic curve of the impedance of each antenna of the same system.

FIG. 3 shows a modified embodiment of the antenna device of the present invention. Since the embodiment in FIG. 2 can adopt tuning (matching) only in a limited range of frequency, variable reactance circuits are interconnected with the elements circuits. A parallel resonance or series resonance circuit is usable as the variable reactance circuit. For example, when using the parallel resonance circuit, its reactance, as shown in FIG. 4, becomes respectively a large plus and a large minus value below and above the resonance frequency fr, whereby fr is properly set to enable the control or reactance component of the element. An element pattern is so designed that units 10, 10', as shown in FIG. 3, are respectively connected to parallel resonance circuits comprising a coil 11 and variable condenser 12 and a coil 11' and variable condenser 12', and the resonance frequency is set to a desired value so that the reactance becomes plus at the frequencies $f_1$-$f_2$-$f_3$, whereby the impedance results in the curve B as shown in FIG. 5. Furthermore, when a condenser 14 is interposed between feed terminals 13 and 13', the impedance is defined by the curve C in FIG. 5, thus obtaining tuning at a frequency $f_2$. It is enough to satisfy tuning condition within the whole zone of frequencies $f_1$-$F_2$-$f_3$ by changing the values of the variable condensers 12, 12' to change the resonance frequency and by changing the reactance component added to the elements 10, 10'.

The embodiment in FIG. 3 employs a parallel resonance circuit. Alternatively, a series resonance circuit is used to provide a required reactance value to thereby, of course, obtain the same tuning as the above. Also the value of the condenser may of course be fixed and the inductance value of the coil made variable.

Figure 6:
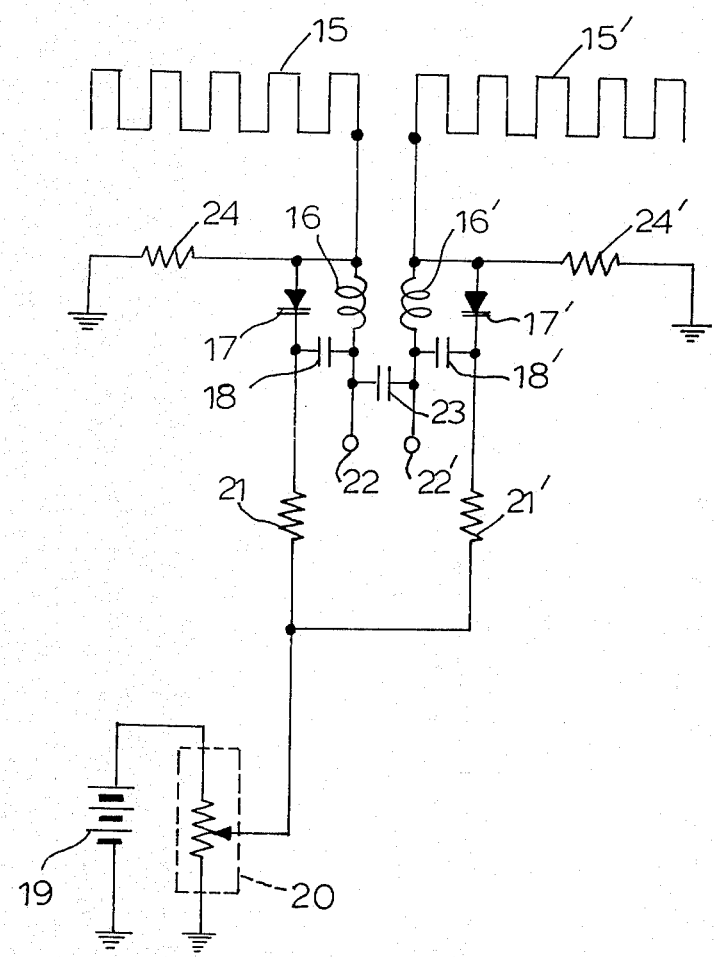
FIG. 6 shows the arrangement of a modified embodiment of the antenna system of the present invention.

FIG. 6 shows another embodiment of the present invention, in which parallel resonance circuits each comprising a coil 16, a barrier capacitor 17 formed from a diode and condenser 18 and a coil 16', barrier capacitor 17' formed from a diode and condenser 18' are connected with respect to elements 15, 15' respectively so that the bias voltage of barrier capacitors 17, 17' is variably divided by a potentiometer 20 from a DC voltage source 19 and is supplied through high-frequency blocking resistances 21, 21'. If a condenser 23 is provided between the feed terminals 22 and 22', tuning is obtainable in the same fashion as the embodiment in FIG. 3 and remote tuning control is possible. In addition, in FIG. 6, reference numerals 24, 24' designate high resistances used as part of the bias voltage feed circuit for barrier capacitors 17, 17'.

As seen from the above, this invention makes it possible to design the antenna, which is very small in length in comparison with the wave length of the frequency in use and tunable at an individual frequency with respect to the whole zone or range of desired frequencies, and which is of elements having negative reactances which are small enough and having very small losses; the invention includes positive reactance control circuits which are small enough to offset the above-noted negative reactance components and yet have small losses.

In other words, a very-small-sized, and lightweight antenna of a high working gain becomes realizable to thereby facilitate installation of the antenna and increase its flexibility when installed. The antenna elements can be produced by etching a printed base or punching metallic foils and are easy and inexpensive to manufacture. In a case of using the printed base, especially, patterns of the elements and circuitry can be formed simultaneously on the same base, thereby enabling integral construction to be advantageous in that there is a reduction of the number of processes required and a resultant improvement in overall reliability. Also, the elements have narrow-band characteristics so as not to tune to signals other than tuning-desired signal and also have interference signal eliminating capability, thereby presenting good receiving performance with respect to the connected receiver.

Figure 7:
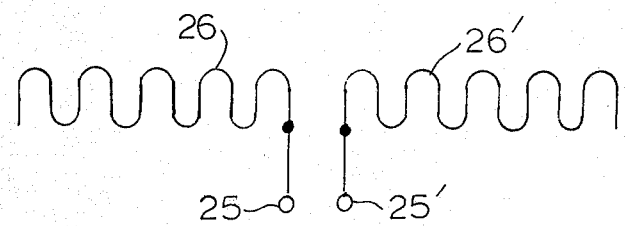
FIGS. 7 through 14 are views of the arrangement of other examples of antenna elements used for the antenna system of the present invention.
Figure 8:
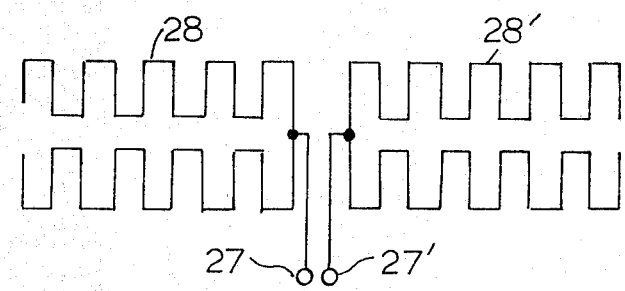
Figure 9:
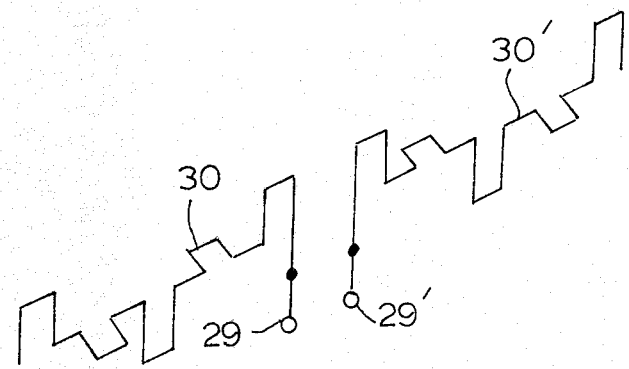
Figure 10:
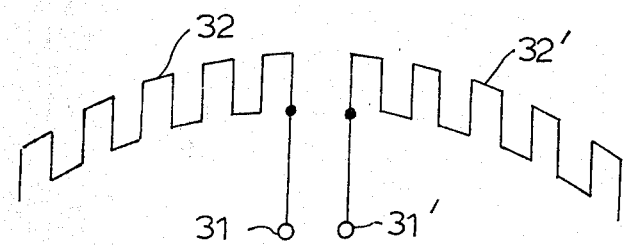
Figure 11:
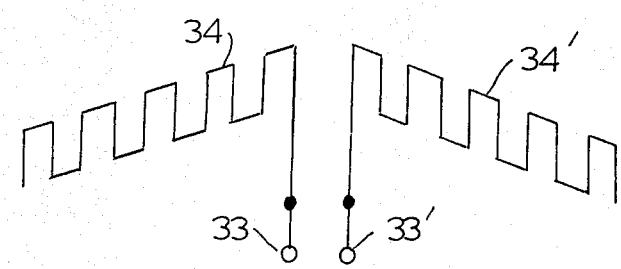
Figure 12:
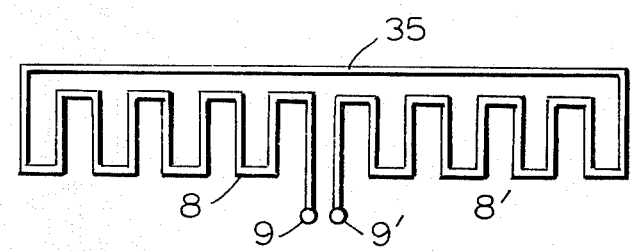
Figure 13:
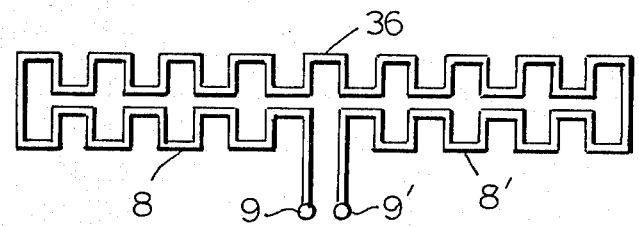
Figure 14:
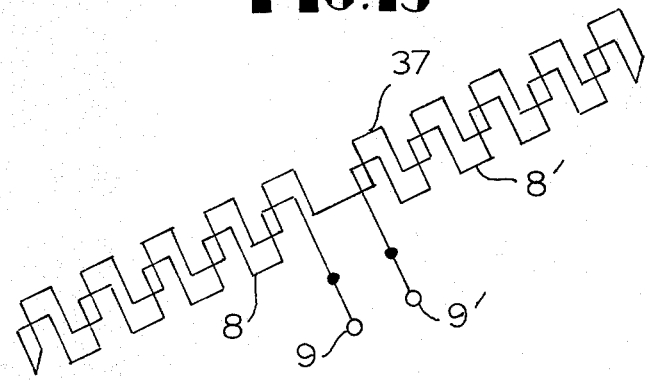
Figure 15:
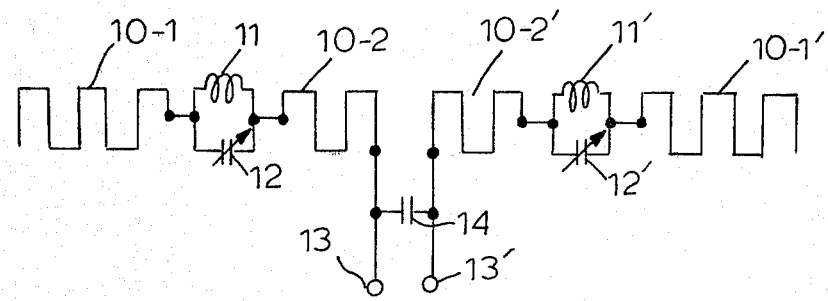
FIGS. 15 and 16 are views of the arrangement of another modified embodiment of the antenna system of the present invention.
Figure 16:
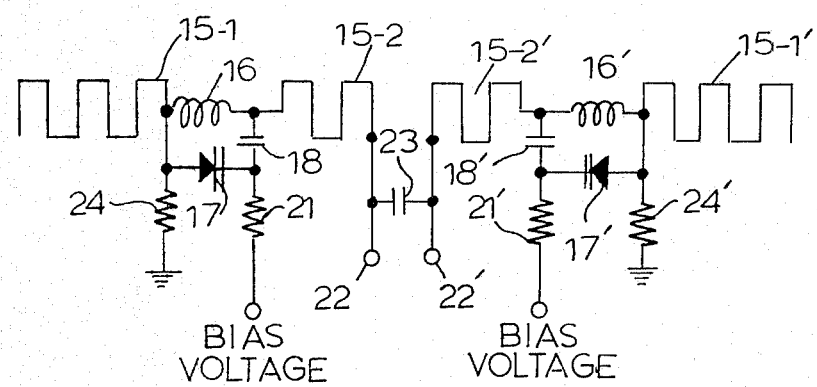

The aforesaid embodiments have pairs of antenna elements 10, 10' and 15, 15' which are formed of turn-back shaped and continuous transmitting conductor ways and have distributed constant impedance, the elements being perpendicular and parallel to the longitudinal direction of the element and bent at right angles at a desired number of points on the same plane, in brief, antenna elements 8, 8' are each formed in a rectangular wave form. Alternatively, antenna elements 26, 26', as shown in FIG. 7, may of course be used, which have feed terminals 25, 25' and comprise transmitting conductor paths of sine-wave-like turn-back shapes. The pairs of antenna elements 10, 10' and 15, 15', are used as shown in FIG. 8, as antenna elements 28, 28' having feed terminals 27, 27' and are of a double construction in a single plane; antenna elements 30, 30', as shown in FIG. 9, have feed terminals 29, 29' and are of a spirally twisted construction; antenna elements 32, 32', as shown in FIG. 10, have feed terminals 31, 31' and are of a construction so as to be in a circular arc; antenna elements 34, 34', as shown in FIG. 11, have feed terminals 33, 33' and are of a construction so as to be in an inverted V-like shape. The pair of elements 8, 8' are connected at their free ends opposite to the feed terminals 9, 9' through a symmetrical transmitting conductor path 35 as shown in FIG. 12, a symmetrical transmitting conductor path 36 of a rectangular wave-form in one plane as shown in FIG. 13, or a symmetrical transmitting conductor path 37 of a rectangular wave-form in a three-dimensional manner as shown in FIG. 14, thereby being usable as a turn-back dipole antenna. In the above embodiments, the variable reactance circuit is connected to the feed sides of the antenna elements. Alternatively, the variable reactance circuit may of course be insertably connected to the antenna elements 10, 10' and 15, 15' as shown in FIGS. 15 and 16.

Figure 17A:
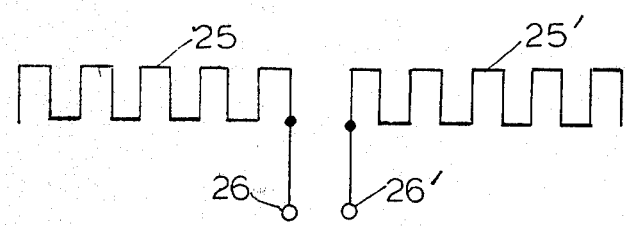
FIG. 17-a shows the arrangement of a further modified example of the antenna elements used for the antenna system of the present invention.
Figure 17B:
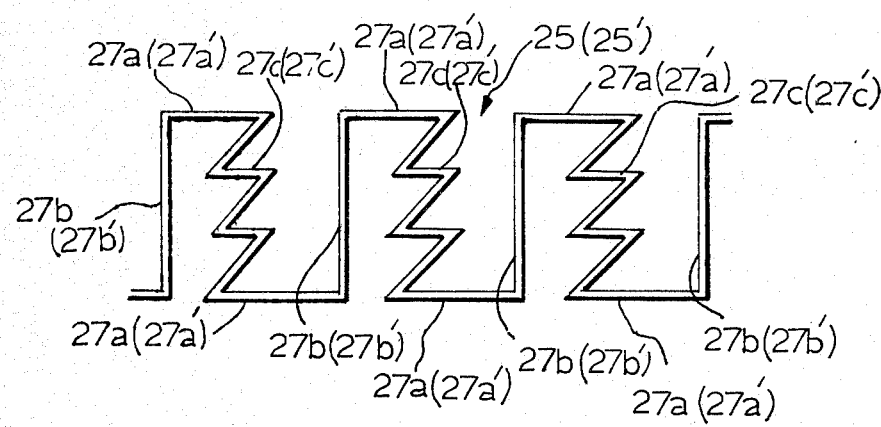
Figure 18:
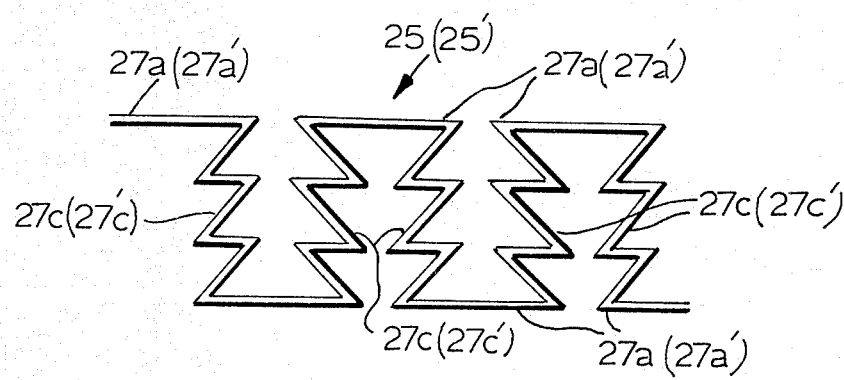
FIGS. 18 through 21 are views of the arrangement of still further examples used for the antenna system of the present invention.

FIGS. 17-a and -b show a further example of antenna element, in which contracted elements 25 and 25' (hereinafter referred to merely as elements 25, 25') employ metallic foil or wire, such as copper, aluminum or iron, of a low electric resistance, or conductive foil on a printed base. The elements 25, 25' are bent at the required points, in the respective directions and at angles, and in the required number of times. The elements 25, 25' are subjected to a distributed constant inductance caused by the arrangement in continuation of the conductors which are distributed alternately lengthwise of and perpendicular to the elements at the bending points and between each bending point. Hence, the elements 25, 25' are equivalent to the elements in the conventional example showing in FIGS. 1-a and -b, the conventional elements being added to coils for eliminating their reactance, whereby the use of the elements 25, 25' requires no concentrated constant coil as in conventional use. The conductors, which comprise the elements 25, 25', are fabricated of material which is of a foil-like shape or a thin tubular shape and of a wide surface areas to thereby greatly reduce losses. Consequently, the problem raised in that coil losses are conventionally very large so as to lower the radiation efficiency can be solved by the present invention and the working gain can be improved so that an antenna which is small-sized can be realized so as to be fully practicable.

The elements 25, 25' comprises conductors 27a, 27a' extending horizontally and lengthwise and those 27b, 27b' extending perpendicular to the conductors 27a, 27a', the conductors 27a, 27a', 27b, and 27b' being arranged in continuation and in a rectangular wave-form. In such elements 25, 25', the conductors 27b, 27b' extending perpendicularly, as shown in FIG. 17-b, include conductors 27c, 27c' which are bent in a zigzag shape a required number of times and are longer than the conductors 27b, 27b'. The elements 25, 25', when turned through the feed terminals 26, 26' are overlapped, and are formed symmetrically to overlap transmitting conductor paths 27, 27'.

In addition, the above embodiment has the elements 25, 25' in which each one of the conductors perpendicular to the longitudinal direction of elements is bent in a zigzag shape only; alternatively, both the perpendicular conductors may be bent in a zigzag shape, in which case, it is convenient to eliminate a flux component to make them symmetrical within one rectangular wave.

Figure 19:
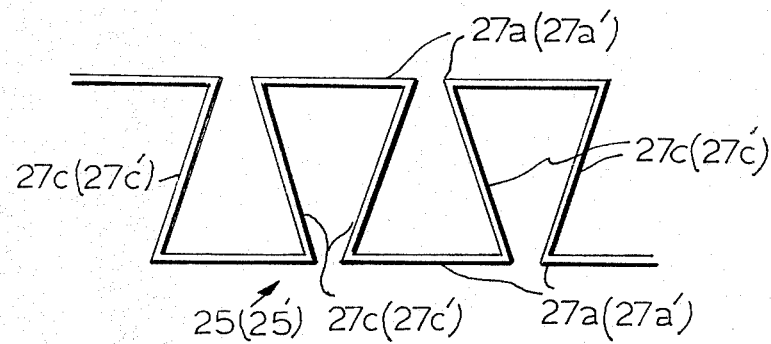

There are at least one zigzag shaped bend, as shown in FIG. 19, in the antenna element.

Figure 20:
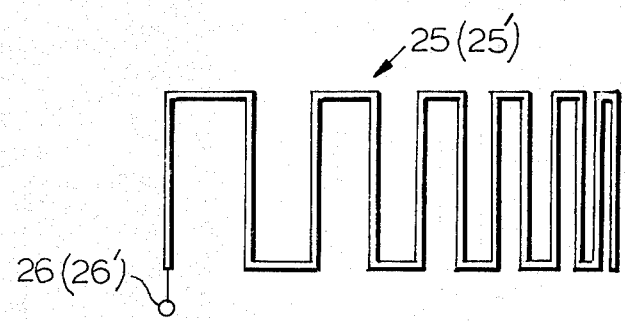
Figure 21:
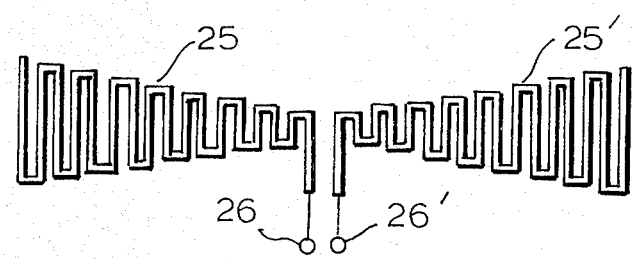

Other than the zigzag bending shapes of conductors perpendicular to the longitudinal direction of each element 25 or 25', the conductors, as shown in FIG. 20, are formed in a pattern of bending the conductors in a zigzag shape so that intervals between bending points become gradually closer as they extend from the feed terminals 26, 26'. Or, the conductors, as shown in FIG. 21, are formed in a pattern of making intervals between the bending points approximately widthwise of the elements as the conductors extend from the feed terminals 26, 26' lengthwise of the elements. Thus, a top loading effect is obtainable. The two-terminal variable reactance circuit, which is provided at the feed side of elements 25, 25' in the above embodiment, may alternatively be interposed within the antenna elements 25, 25' and connected thereto.

FIG. 22 shows still another example of antenna elements used for the antenna device of the present invention, in which contracted antenna elements 28, 28' (hereinafter referred to merely as elements 28, 28') have distributed constant inductance and employ metallic foil or wire of low electric resistance value, such as of copper, aluminum or iron, or a conductive foil on a printed base and are formed in a pattern of bending the elements at the required points, in the respective directions and angles, and in the required number of times. The elements 28, 28' are subjected to a distributed constant inductance caused by bending the conductors and by arranging in continuation the conductors which are distributed alternately lengthwise of and perpendicular to the elements at the bending points and between each bending point, thereby being equivalent to the elements in the conventional example with coils for eliminating the reactance of elements as shown in FIGS. 1-a and 1-b. Hence, such elements 28, 28' are used so as to require no concentrated constant coils as in conventional designs. The conductors, which may be of a material such as foil or a thin tube having a wide surface area, can greatly reduce the losses. Hence, the problem of a very large loss in an added coil and the resultant lowering of the radiation efficiency can be solved, the working gain can be improved, and an antenna, even small-sized, can be realized so as to be fully practicable.

In this instance, the elements 28, 28', as shown in FIG. 23-a, are bent at a given angle around the broken line 30 and are formed in a nearly V-like shape extending lengthwise of the elements 28, 28', in which the element pattern is zigzag so as to thereby extremely restrict the generation of flux in comparison with the usual added coils. The elements 28, 28', if composed of metallic foil or wire, are kept in a bent condition by a base coincident with the bending form, and, if composed of metallic foil on the printed base, employs a flexible base.

In addition, in this embodiment, the elements are bent in a nearly V-like shape (see FIG. 23b). Alternatively, the elements 28, 28' may be bent at the broken lines 30, 31 as shown in FIG. 24-a and may be formed in a U-like shape as shown in FIG. 24-b; they also may be bent at the broken lines 30, 31 and 32 as shown in FIG. 25-a to be formed in an approximately W-like shape as shown in FIG. 25-b or nearly in a triangular shape as shown in FIG. 25-c; they also may be bent at the broken lines 30, 31, 32 and 33 as shown in FIG. 26-a and formed in a rectangular shape as shown in FIG. 26-b. The elements may be formed in a rolled shape as shown in FIGS. 27-a and 27-b, or in an overlapped rolled shape as shown in FIGS. 28-a and 28-b, or in a circular arc shape as shown in FIGS. 29a and 29b.

Furthermore, the antenna elements, when attached to a transparent flexible base and used in a single plane, can be attached to a glass window, which is useful especially for an antenna device for a car radio.

As seen from the above, according to the present invention, the antenna, which is very small in length in comparison with wave length in use and is tunable at an individual frequency with respect to a whole zone in a required frequency range, is able to be composed of elements which have small negative reactances and are very small in their losses, and with a positive reactance control circuit small enough to offset and control the small negative reactance components of the elements, that is, a positive reactance control circuit small in its losses. Thus, a plane antenna of high operational gain, super-small-sized, and lightweight construction is realizable. Hence, the antenna is easy to mount and increases its flexibility for its installation. Also, the elements can actually be produced by etching the print base or punching the metallic foil, thereby being easy to produce and inexpensive. When using the printed base, the element and circuitry can be formed in a pattern simultaneously on the same base, thereby enabling the integral formation thereof, a low cost to manufacture, a reduction of the number of processes, and an improvement of reliability.

Since narrow-band characteristic is presented, the antenna is not tuned to a signal other than the desired signal and has good interference signal eliminating capability, thereby making it possible to present good receiving performance with respect to the connected receiver. Furthermore, the element pattern, which is zigzag in continuation of transmitting conductor paths, is reducible in a space factor when rolled along the longitudinal direction of the element, and the coil-like shaped element generates no flux, thereby being usable as an antenna of a high working gain.

Figure 30:
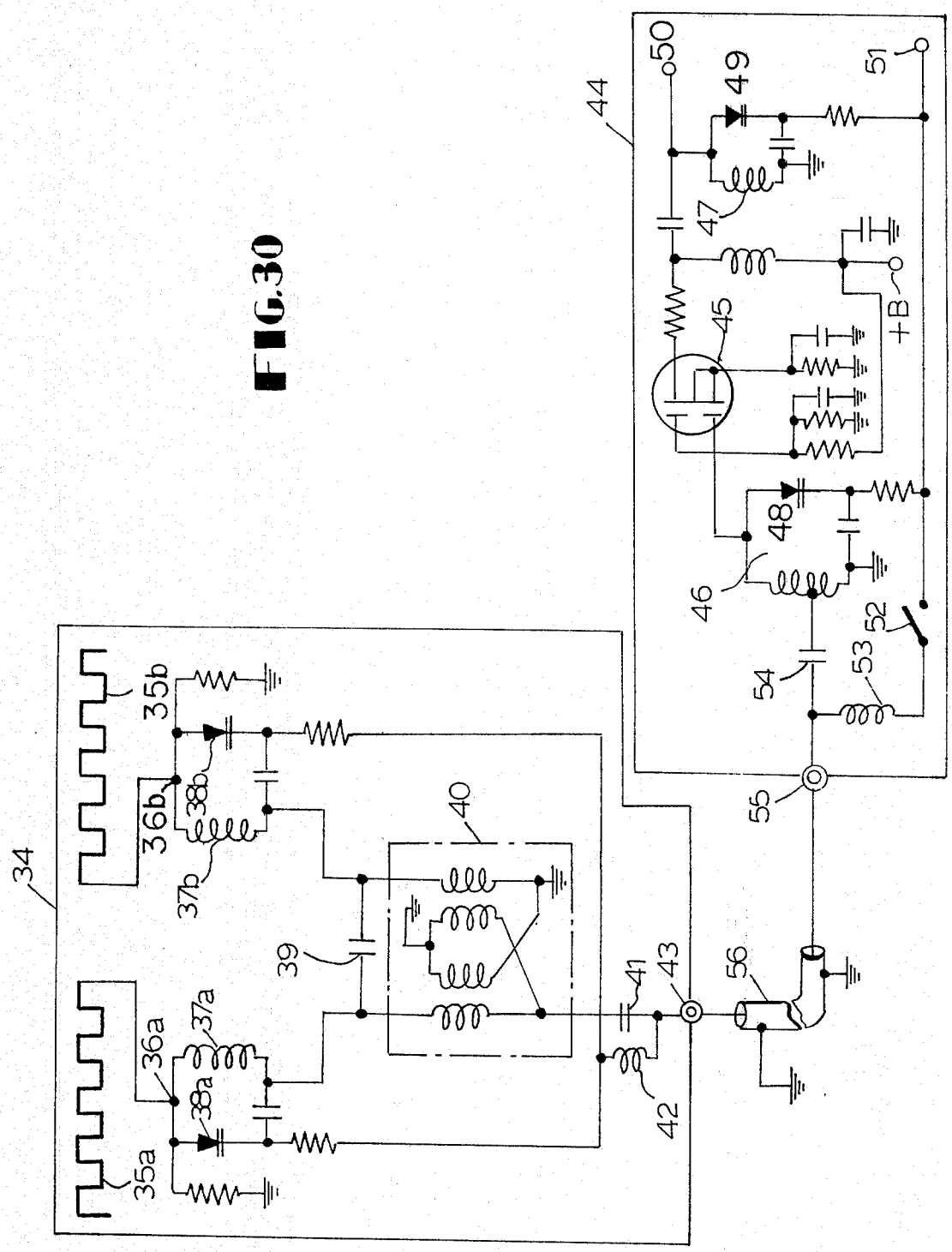
FIG. 30 is a circuit diagram of still another modified embodiment of the present invention.

Referring to FIG. 30, an antenna circuit 30 is constructed as follows: Reference numerals 35a, 35b, designate a pair of antenna elements of bent conductors made from copper, aluminum or iron, of low electrical resistance value. The conductors are distributed alternately lengthwise of or perpendicular to the elements and arranged in continuation of each other so as to generate a distributed constant inductance. Since the distributed constant inductance can eliminate the reactance of the antenna element, the impedance looking from feed terminals 36a, 36b can be adjusted to a predetermined value at the desired frequency. Also, material like a foil or a thin tube having a wide surface area is usable as the conductor, whereby the losses are considerably reduced. As a result, the antenna elements 35a, 35b, which are more small-sized than the conventional elements can be used to construct an antenna having a large working gain. Reference numerals 37a, 37b designate variable reactance circuits connected to feed terminals 36a, 36b of antenna elements 35a, 35b respectively and having variable capacity diodes 38a, 38b as variable elements. When capacity values of diodes 38a, 38b are properly controlled to properly set resonance frequency fr of the variable reactance circuits 37a, 37b which are changeable as shown in FIG. 4, the reactance component at the antenna elements 35a, 35b are controllable. In addition, reference numeral 39 designates a condenser for adjusting the impedance and connected between feed terminals, element 40 designates a balanced-unbalanced converter (balun), element 41 designates a condenser for passing therethrough high-frequency receiving signal, element 42 designates a high-frequency choke coil, and element 43 designates an output terminal.

On the other hand, reference numeral 44 designates a high frequency stage of a receiver, in which a well-known high-frequency amplifier 45 and variable capacity diodes 48, 49 are interposed within resonance circuits 46 and 47 respectively. Reference 50 designates a terminal connected to a second high-frequency amplifier or mixer (not shown); element 51 designates a terminal applied with bias voltage to the variable capacity diodes 48, 49; element 53 designates a high-frequency choke coil; element 54 designates a condenser for passing therethrough a high-frequency signal; element 55 designates an input terminal to the receiver 44.

The output terminal 43 at the antenna circuit 34 and the input terminal 55 at the receiver 44 are connected through a high-frequency coaxial cable 56.

To realize the above connection, the above embodiment connects the antenna circuit to the receiver 44 with a high-frequency coaxial cable 56; bias voltage, applied to the variable capacity diodes 48, 49 from the terminal 51 of receiver 44, is applied to the variable capacity diodes 38a, 38b at the antenna circuit 34 through a switch 52, high-frequency choke coil 53, input terminal 55, high-frequency coaxial cable 56, input terminal 43, and high-frequency choke coil 42, thereby changing resonance frequency fr of variable reactance circuits 37a, 37b, and thus enabling the antenna circuit 34 to tune by remote control from the receiver 44 location. In this instance, the high-frequency receiving signal from the antenna circuit 34 is of course transmitted to the high-frequency stage through the condenser 41, input terminal 43, high-frequency coaxial cable 56, input terminal 55 and condenser 54.

In addition, in such a receiving device, it is desirable for the variable capacity diodes 38a, 38b of antenna circuit 34 to have the same variation characteristics as the variable capacity diodes 48, 49 of receiver 44.

Alternatively, the variable reactance circuit 37a, 37b may be interposed in other positions of antenna elements 35a, 35b or formed by a series resonance circuit. Resistances of about 100 KΩ may be used instead of the choke coils 42, 53 so as to obtain the same effect. The switch 52, when using a conventional antenna, may be kept open.

In the case wherein the receiver 44 utilizes the so-called preset system, a preset d.c. voltage is changed over to be applied to the terminal 51 in FIG. 30, in which case the voltage is enough to be applied as a bias voltage to the variable capacity diodes 38a, 38b of the antenna circuit 34.

When a variable condenser is used as the tuning element of receiver 44, a d.c. voltage which changing continuously is picked-up by changing volume in association with the rotation of variable condenser, and is applied to the variable capacity diodes 38a, 38b of antenna circuit 34.

As seen from the above, this invention connects, by way of the high-frequency coaxial cable, the receiver with the antenna circuit having small-sized antenna elements and using variable capacity diodes as the variable reactance element, so that d.c. voltage relating to the tuning element at the receiver is applied to the variable capacity diode at the antenna circuit by way of the high-frequency coaxial cable, whereby the tuning of antenna circuit is remote-controllable from the receiver and the receiving device of very simple construction is provided to thereby obtain such a superior effect.

Figure 31:
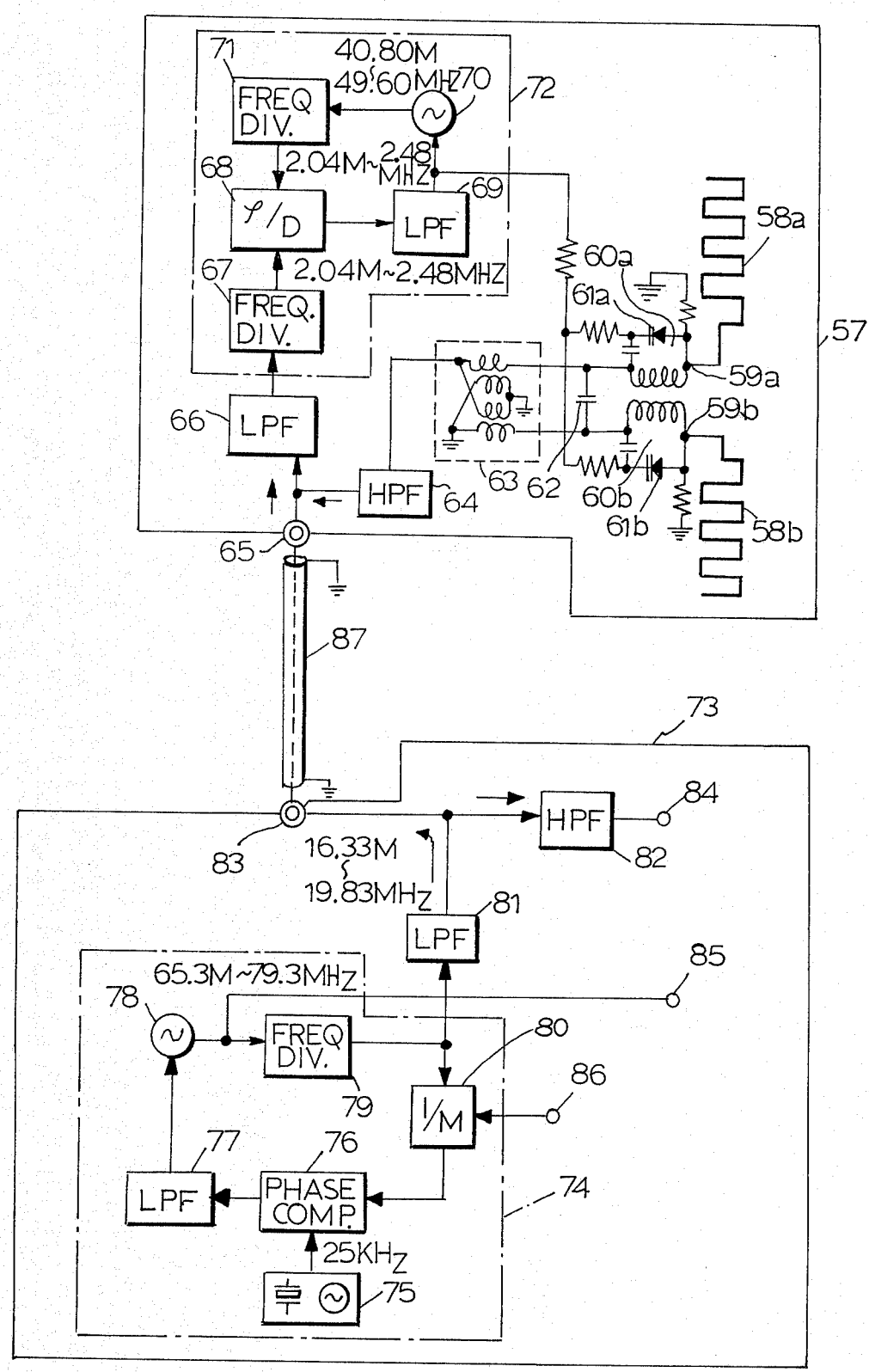
FIG. 31 is a circuit diagram of a yet another modified embodiment of the present invention.

In FIG. 31, an antenna circuit is constituted as follows: A pair of antenna elements 58a, 58b comprise bent conductors, such as copper, aluminum or iron, of low electrical resistance value, the conductors being distributed alternately lengthwise of or perpendicular to the elements and arranged in continuation to thereby generate a distributed constant inductance. Since the distributed constant inductance can eliminate the reactance of the antenna elements 58a, 58b, the impedance viewed from feed terminals 59a, 59b is fixed at a given value at a required frequency and foil-like or thin-tube-like conductors having wide surface areas are usable to considerably reduce losses. As a result, an antenna of large working gain can be formed by the use of antenna elements 58a, 58b which are smaller than the conventional elements. Variable reactance circuits 60a, 60b are connected to feed terminals 59a, 59b respectively, which have variable capacity diodes 61a, 61b as variable elements. The resonance frequency fr of variable reactance circuits 60a, 60b, which is properly controlled to vary the capacity values at diodes 61a, 61b as shown in FIG. 4, is properly set to enable control of the reactance component of the antenna elements 58a, 58b. In addition, reference numeral 62 designates a condenser for adjusting the impedance and is connected between the feed terminals 59a, 59b; element 63 designates a balanced-unbalanced converter (balun); element 64 designates a high-pass filter for passing therethrough the high-frequency receiving signal; element 65 designates an output terminal; element 66 designates a low-pass filter for passing therethrough a control signal from the receiver; element 67 designates a frequency divider; element 68 designates a phase detector; element 69 designates a low-pass filter; element 70 designates a voltage control oscillator (VCO); and element 71 designates a frequency divider, so arranged such that the combination of the phase detector 68 through frequency divider 71 constitutes a well-known PLL (phase locked loop) circuit, and the PLL circuit and frequency divider 67 constitute a frequency discriminator 72.

Reference numeral 73 designates the high-frequency stage of a receiver; element 74 designates a synthesizer unit composed of a PLL circuit; element 75 designates a reference oscillator; element 76 designates a phase comparator; element 77 designates a low-pass filter; element 78 designates a VCO; element 79 designates a frequency divider; element 80 designates a program counter; element 81 designates a low-pass filter for passing therethrough an output signal of the frequency divider 79; element 82 designates a high-pass filter for passing therethrough the high-frequency receiving signal from the antenna circuit 57; element 83 designates an input terminal of the receiver; element 84 designates a terminal connected to the front end; element 85 designates a terminal connected to a mixer; element 86 designates a terminal having a code applied thereto for setting the receiving frequency. The output terminal 65 of the antenna circuit 57 and the input terminal 83 of the receiver 73 are connected through a high-frequency coaxial cable 87.

In order to actually complete the above configuration, in the above embodiment, the output of the frequency divider 79 of the synthesizer unit 74 provided within the receiver 73 is adapted to be used as a control signal. In detail, the control signal is fed to the antenna circuit 57 by way of the low-pass filter 81, input terminal 83 and coaxial cable 87, and is applied to the frequency divider 67 by way of the low-pass filter 66, and, after being stepped down to the proper frequency, is applied to PLL circuits 68 to 71, so that a d.c. voltage corresponding to the frequency of the control signal is picked-up from the output side of low-pass filter 69 and is applied to the variable capacity diodes 61a, 61b. By this technique, remote control of the tuning is possible from the receiver 73 side. The high-frequency receiving signal from antenna circuit 57 is fed to the input terminal 65 through the high-pass filter 64 and fed to the front end through the coaxial cable 87, input terminal 83, high-pass filter 82 and terminal 84. In addition, the numerals in FIG. 31 represent exemplary frequencies within the FM band (receiving frequency 76MHz to 90MHz) utilized in Japan.

Alternatively, the frequency discriminator 72 may employ a pulse-count wave-detector, Foster-Seeley type wave-detector, ratio type wave-detector, double staggered resonance type wave-detector, or slope wave-detector. When the division ratio of frequency divider 67 is properly set, the output of VCO of course may be used, unaltered as the control signal. The variable reactance circuits 60a, 60b may be connected to the antenna elements at positions other than that shown.

As seen from the above, the antenna device of the present invention is so constructed that the antenna circuit having the small-sized antenna elements is provided with the frequency discriminating circuit, and the VCO output of the frequency division output thereof in the synthesizer receiver is supplied as the tuning control signal to the frequency discriminating circuit, so that the d.c. voltage output of the frequency discriminating circuit may be applied to the variable capacity diodes provided at the antenna circuit, thereby making it possible to remote-control the tuning of the antenna circuit from the receiver for superior receiving ability.

Figure 32:
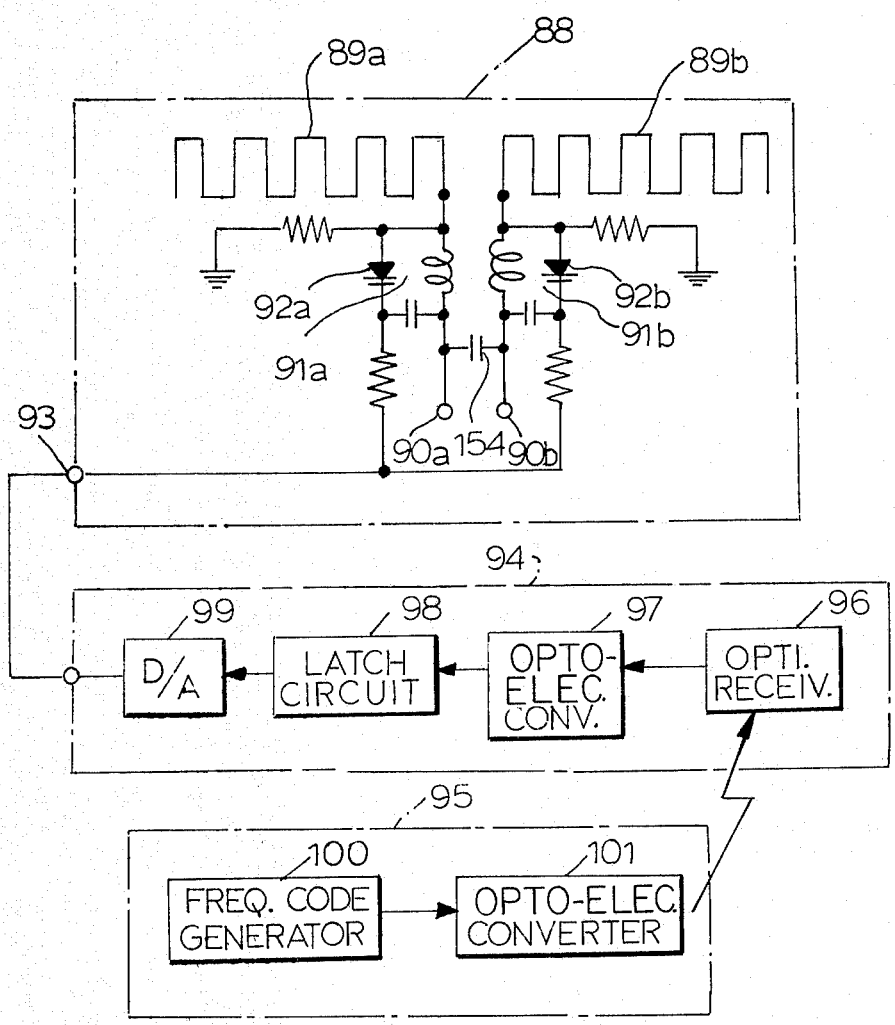
FIG. 32 is a circuit diagram of a further modified embodiment of the present invention.

An antenna circuit shown in FIG. 32 is constructed as follows: A pair of antenna elements 89a, 89b comprise bent conductors, such as copper, aluminum, or iron, having a low electrical resistance value, the conductors being distributed alternately lengthwise of and perpendicular to the elements and arranged in continuation, thereby generating a distributed constant inductance. The distributed constant inductance, which is able to eliminate the reactance of the antenna elements, enables the impedance viewed from feed terminal 90a, 90b to have a given value at the required frequency and conductors of a foil-like or a thin tube-like shape and which have a wide surface area are usable so as to reduce the losses. As a result, by the use of antenna elements 89a, 89b which are small-sized as compared with the conventional elements, one can construct an antenna with a large working gain. Variable reactance circuits 91a, 91b are connected to the feed terminals 90a, 90b at antenna elements 89a, 89b and are provided with variable capacity diodes 92a, 92b used as variable elements, respectively. The resonance frequency fr of the variable reactance circuits 91a, 91b is changeable, as shown in FIG. 4, by proper control of the capacity values of diodes 92a, 92b and may be properly set to enable the control of reactance component of antenna elements 89a, 89b. In addition, reference numeral 154 designates a condenser connected between the feed terminals 90a, 90b for adjusting the impedance; element 93 designates an input terminal for the control signal.

First and second control circuits 94, 95 are constructed as follows: The first control circuit 94 comprises an optical receiver 96 for receiving optical codes, an opto-electric converter 97 for converting the output of the optical receiver into an electrical value, a latch circuit 98 to store the opto-electric output, and a digital-to-analog converter 99 to convert the output of the latch circuit 98 into an analog voltage. The second control circuit 95 comprises a code generator 100 to generate codes for setting the frequency and an opto-electric converter 101 for converting the codes into light (especially infrared rays).

In order to actually perform the above, the above embodiment once converts the code for setting frequency into an optical code, the optical code is converted into an electrical value after optical receipt thereof and then into an analog voltage, which is the applied to variable capacity diodes 92a, 92b.

Hence, a digital signal is usable to control the tuning of small-sized antenna. The first and second control circuits, which are disposed apart from the antenna circuit, enable remote control. Furthermore, when the first control circuit is incorporated with the antenna circuit and the second control circuit only is apart therefrom, or both the first and second control circuits are apart from the antenna circuit, the remote control also is possible, thereby considerably increasing the flexibility of the design of the remote control. Moreover, a frequency code generator, when used for controlling a variable frequency divider at PLL of the synthesizer tuner by performing as a code generator for setting the frequency, can be simply added to a conventional synthesizer tuner using a conventional antenna.

Figure 33:
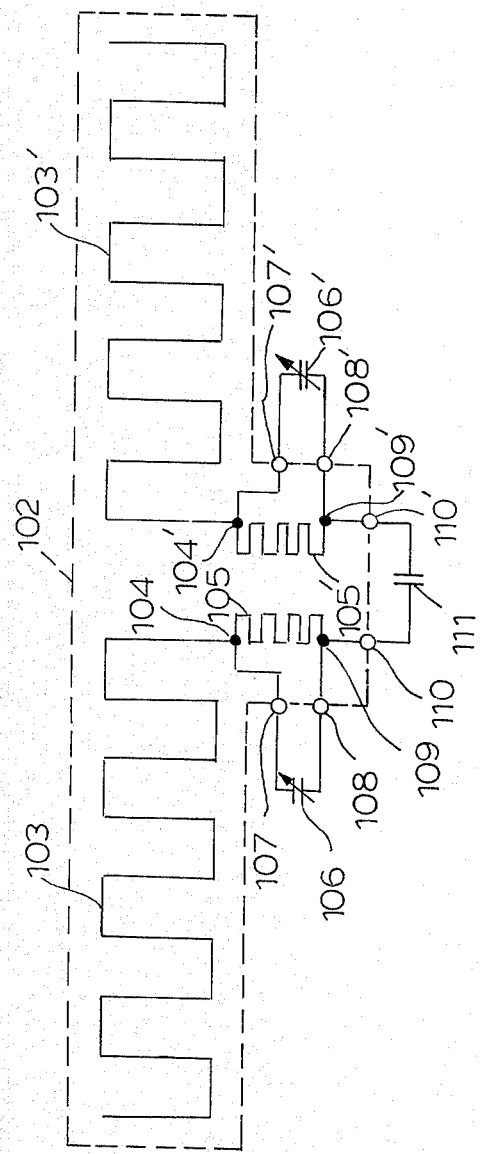
FIG. 33 shows the arrangement of a still further modified embodiment of the antenna system of the present invention.

In FIG. 33, on a printed circuit base 102 are printed antenna element patterns 103, 103' and distributed constant inductance coils 105, 105' used as inductance components for the tuning circuits connected to pattern connection points 104, 104' at the feed terminal side of element patterns 103, 103'. On the printed circuit base 102 are printed lead wire paths from the points 104, 104' to terminals 107, 107' which are connected to variable condensers 106, 106' used as variable capacitance components of the tuning circuits; also printed on the base 102 are lead wire paths from the other terminals 108, 108' connected to the variable condensers 106, 106' to the other pattern points 109, 109' and lead wire paths from the pattern points 109, 109' to feed terminals 110, 110'. An impedance adjusting condenser 111 is connected between the feed terminals 110 and 110'. The variable condensers 106, 106', other components of the tuning circuits, and the impedance adjusting condenser 111 are directly mounted at lead terminals at both ends on the lead wire paths between the terminals 107, 107' and 110, 110', or inserted into holes in the lead wire paths.

Figure 34:
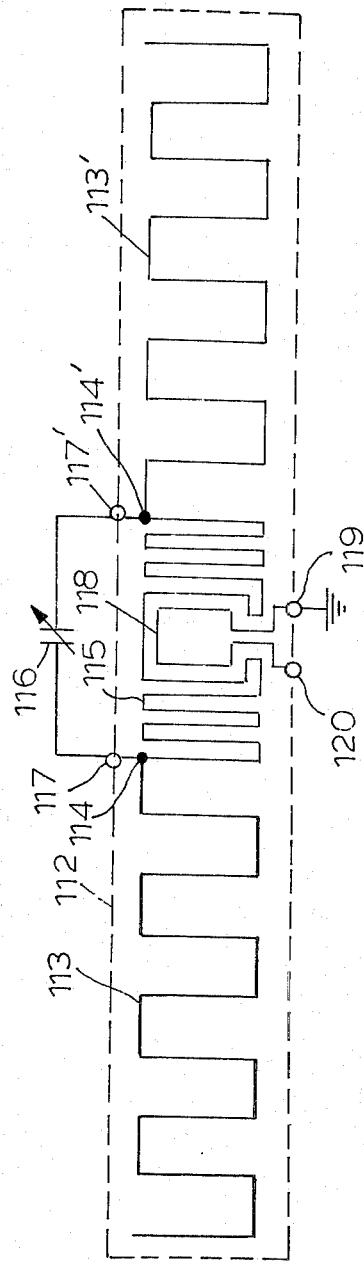
FIG. 34 shows the arrangement of yet a further embodiment of the antenna system of the present invention.

FIG. 34 shows a yet further embodiment of an antenna system of the present invention. In FIG. 34, on a printed wiring base 112 are printed antenna element patterns 113, 113' having a distributed constant inductance, and also printed is a distributed constant inductance coil 115, serving as the inductance component of the tuning circuit, and connected between pattern points 114, 114' at the feeding side of the element patterns. On the printed wiring base 112 are also printed lead wire paths extending to a terminal 117 connecting a variable condenser 116; also printed is a lead wire path extending from the other terminal 117' connecting the variable condenser 116 with the pattern point 114'; the other end of inductance coil 115 and the printed lead wire paths connecting a ground terminal 119 and feed terminal 120 to the secondary coil 118, together with the primary coil 115 forms a transformer. The transformer provides a balanced-unbalanced function as well as an impedance change function. The variable condenser 116, which is the other component of the tuning circuit, is mounted at both end lead terminals directly on the lead wire paths to points 117, 117', or inserted into holes formed in the paths.

In addition, in the above embodiment, antenna elements 103, 103', 113 and 113' and inductance coils 105, 105' and 115 are each formed in a simple zigzag pattern, may of course be formed of a desired pattern having a required inductance value.

As seen from the above, this invention can reduce the number of parts and improve workability, thereby providing an antenna having a very low cost to produce. Elements and coils are mass-produced in the same pattern, considerably reducing the dispersion of their electrical parameters. Also, the elements and coils, which have plane patterns having distributed constants and having no closed loop current paths, generate no magnetic flux. On the contrary, they are not affected by an external magenetic flux and these distributed constant inductance elements or coils decrease losses in comparison with concentrated pumped constant inductances, thereby being largely advantageous in the improvement of the working gain, stability, and reliability of the antenna system. Furthermore, the antenna having a plane pattern can actually be provided to thereby increase flexibility in installation or design.

FIGS. 35 through 39 are views explanatory of an antenna system of the present invention, in which band change-over and tuning at an antenna and receiver are associated with each other so that tracking for the antenna and receiver is always carried out in a wide range of tuning frequencies without changing a fixed number of parts constituting the antenna elements and tuning circuits.

Generally, in antennas of the tuning type, the impedance possessed by antenna elements and a range of variable-adjusting tuning circuits connected to the elements, are determined by each structural form or material and are limited thereto. Hence, these tuning antennas have the tuning frequency range limited so as not to optionally change it, whereby a problem is raised in that it is inconvenient to carry out tracking in connection with other tuning systems.

This invention aims at providing an antenna system of the tuning type, which is capable of overcoming such conventional problems and is capable or desirably adjusting a tuning frequency range, and also aims at a receiving device always coincident with a receiver in a receiving band and at a tuning frequency.

Figure 35:
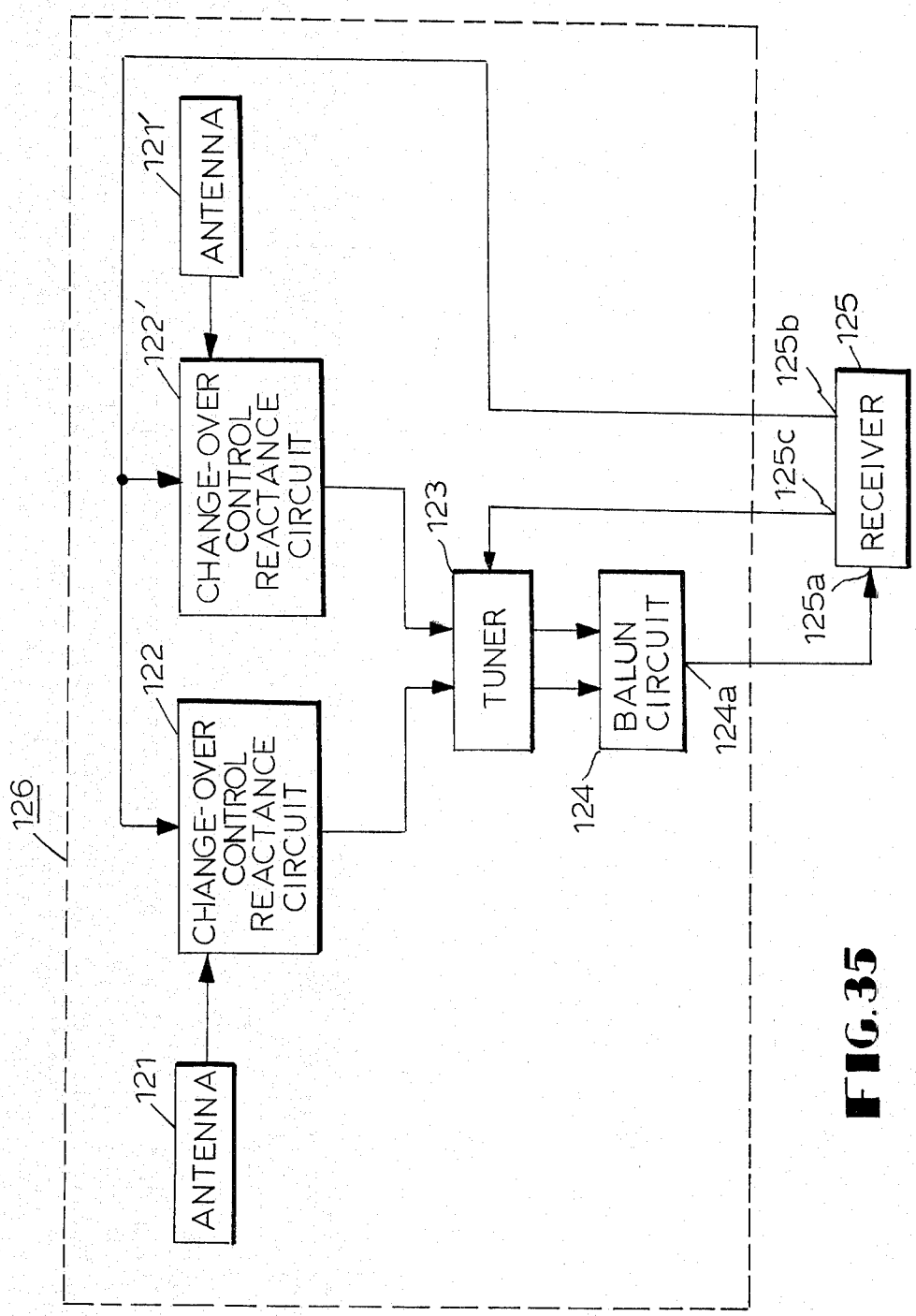
FIG. 35 is a block diagram of an embodiment of a receiving device of the present invention.

Next, an embodiment of the receiving device of invention will be detailed in accordance with the drawings. FIG. 35 is a block diagram of the basic configuration of a receiving device of the present invention, in which reference numerals 121, 121' designate antenna elements to which change-over control reactance circuits 122, 122' are connected. A tuner 123 and a balanced-unbalanced mode converter 124 (hereinafter referred to merely as a balun) are connected to the change-over control reactance circuits 122, 122'. An unbalance output terminal 124a at the balun 124 is connected to an antenna input terminal 125a of receiver 125 through a coaxial cable. A band change-over signal, itself obtained by the change-over of the receiving band at the receiver 125, or a band change-over control signal converted into a desired signal form, is output from a band change-over control signal ouput terminal 125b at the receiver 125 and then fed to the change-over control reactance circuits 122, 122'. The change-over control reactance circuits 122, 122' set a positive or negative reactance corresponding to the band change-over control signal, the set reactance being added in series with the antenna elements 122, 122'. The tuning control signal, itself obtained by the setting of the tuning frequency at receiver 125, or a tuning control signal converted into the desired signal form, is output from a tuning control signal output terminal 125c at receiver 125 and fed to the tuner 123, whereby in the set band, the receiver 125 and antenna unit 126 are always kept so as to obtain tracking. In the above description, the dipole antennas are exemplified by a pair of antenna elements 121, 121'. Alternatively, a mono-pole type antenna of a single antenna element may be applicable. Instead of the balun 124 converting the unbalanced output signal, the balanced output signal may be directly fed to the receiver 125 if it has a balanced antenna input terminal pair. Also, the change-over control reactance circuits 122, 122' may be disposed at intermediate positions within the antenna elements 121, 121' respectively.

Figure 36:
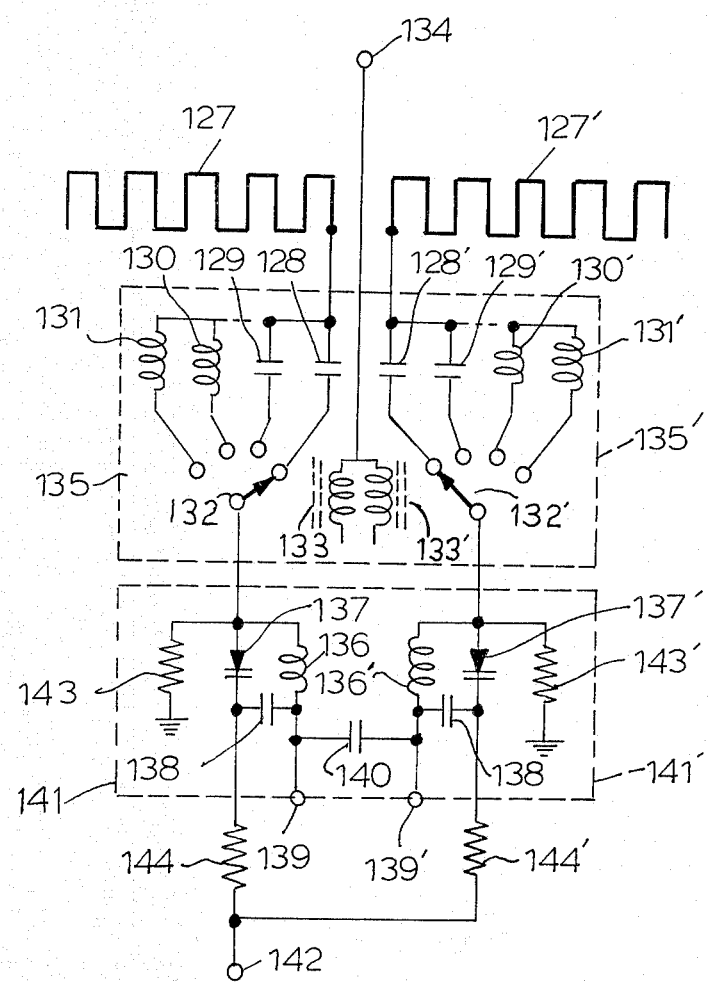
FIG. 36 is a circuit diagram of a concrete arrangement of an antenna portion thereof.
Figure 37A:
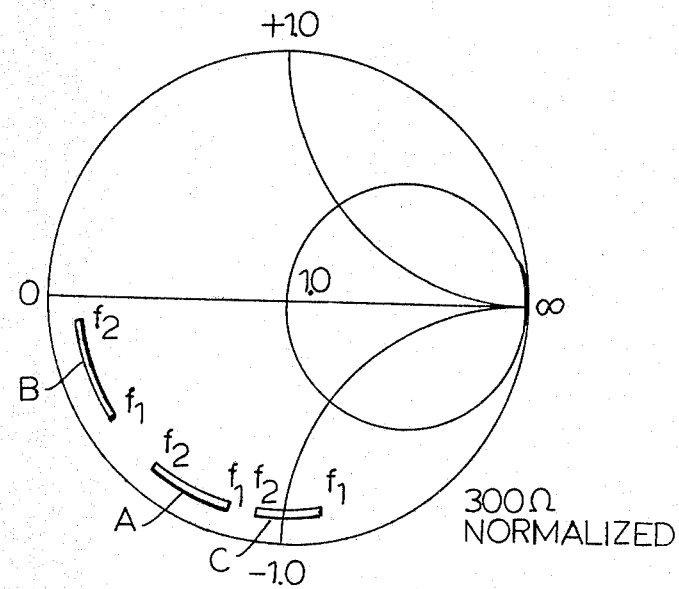
FIGS. 37a, b and 38a, b are illustrations of the operation principle of the system.
Figure 37B:
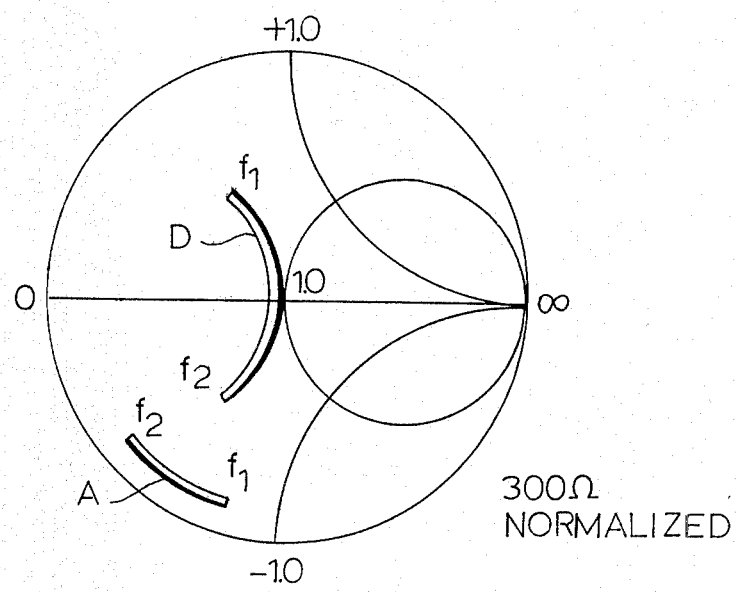
Figure 38A:
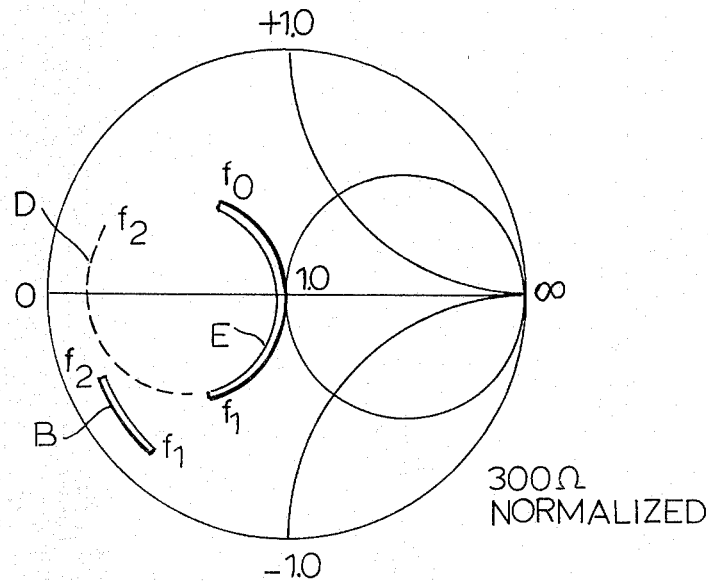
Figure 38B:
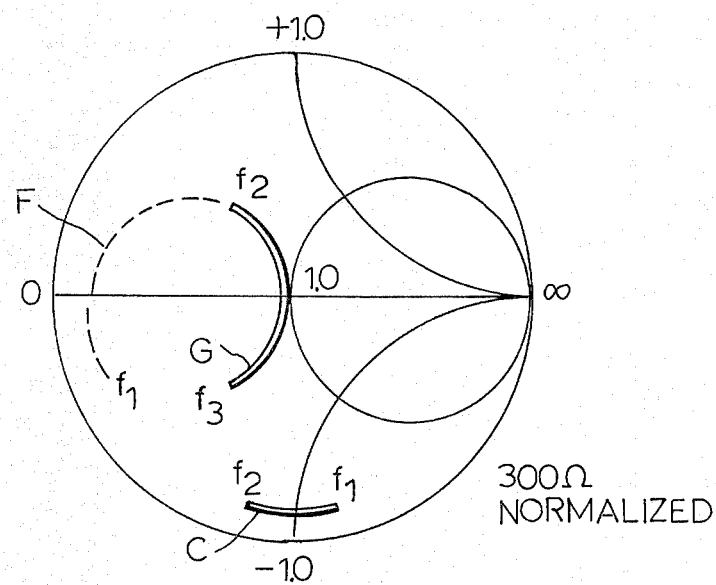

In FIG. 36, only the impedance at frequencies $f_1$ to $f_2$ of distributed constant inductance elements 127, 127' is represented by a curve A in FIG. 37-b. Fixed condensers 128, 128', 129 and 129' and fixed coils 130, 130', 131 and 131' are connected to the antenna elements. Change-over control reactance circuits 135, 135' comprising change-over switches 132, 132' and exciting coils 133, 133' which are arranged so as to change over the reactance circuits to a required change-over terminal, are connected to the elements, so that, for example, when the switches 132, 132' are changed over to connect the fixed coils 131, 131', the impedance travels on the curve B in FIG. 38a. In the case where, between the parallel resonance variable reactance circuits comprising a coil 136, variable condenser 137, condenser 138, a coil 136', variable condenser 137', and condenser 138', and the feed terminals 139, 139', is interposed a tuning circuit 141 comprising an impedance adjusting condenser 140, the impedance at $f_1$ to $f_2$ travels until the curve D shown by the broken line in FIG. 38-a, alternatively becomes tunable in a frequency range of $f_0$ to $f_1$ lower than $f_1$ to $f_2$ as shown by the curve E. On the contrary, in FIG. 36, when the switches 132, 132' are changed over to connect to the distributed constant inductance elements 127, 127', for example, the fixed condensers 128, 128', the impedance travels on the curve C in FIG. 38-b. Furthermore, when the tuning circuit 141 comprising impedance adjusting condenser 140 is connected between the feed terminals 139, 139' and the parallel resonance variable reactance circuits comprising the coil 136, variable condenser 137, condenser 138, coil 136', variable condenser 137', and condenser 138'; the impedance at $f_1$ to $f_2$ travels along the curve F as shown by the broken line in FIG. 38-b, and alternatively becomes tunable in a frequency range of $f_2$ to $f_3$ higher than $f_1$ to $f_2$ as shown by the curve G, where the varible condenser 137, 137' change their capacity in accordance with the tuning control signal applied to the terminal 142, and resistances 143, 143', 144 and 144' are provided for blocking the high-frequency. When the reactance of each fixed coil 130, 130', 131, 131' is set independently to a desired value, the coils are changed over to make it possible to optionally select a range of tunable frequencies. In order to get tracking at receiver 125 and tuning frequency in FIG. 35, a band change-over control signal corresponding to the band change-over within the receiver 125 is fed to the terminal 134, and the tuning control signal corresponding to the tuning control is fed to the terminal 143. In addition, in the above explanation, four kinds of fixed condensers and fixed coils are represented, but various combinations thereof may of course be provided corresponding to the required change-over bands.

In the above description, the parallel resonance variable reactance circuit is used in the tuning circuit 141. Alternatively, a series resonance variable reactance circuit may of course be used. The variable capacity elements 137, 137' used as the variable reactance elements has hitherto been described, but variable inductance elements of course may be used to form the resonance circuit.

Figure 39:
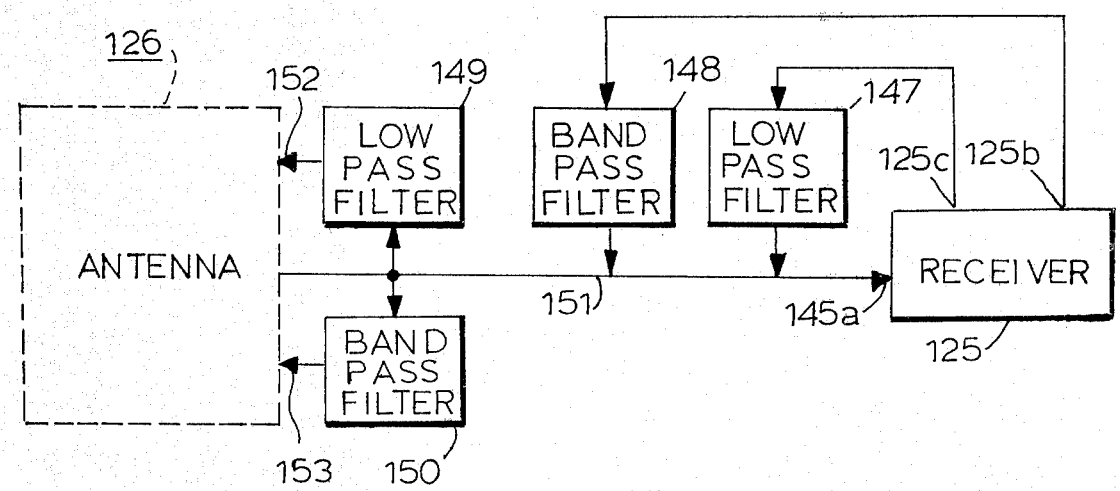
FIG. 39 is a block diagram of another embodiment of the receiving device of the present invention.

FIG. 39 shows a modified embodiment of the receiving device of the present invention, in which the control signal is superposed between the receiver and the antenna unit. At the tuning control signal output terminal 125c of receiver 125 is provided a low-pass filter 147 for blocking the received high-frequency signal and passing the d.c. tuning control signal, the output terminal being connected to a receiving signal feeding line 151. On the other hand, at the band change-over control signal output terminal 125b is provided a band-pass filter for blocking the received high-frequency signal and the d.c. tuning control signal and for passing a pulse train signal having a required repetition period, cycle repetitions, or required different pulse-heights, the output terminal being connected to the receiving signal feeding line 151. At the antenna unit 126 is disposed a low-pass filter 149 of the same characteristics as the low-pass filter 147. The low-pass filter 149 is connected at its input terminal to the receiving signal feeding line 151 and at its output terminal to a teriminal 152 connected to the tuning control signal terminal within the antenna unit 126. A band-pass filter 150 of characteristics identical with that of the aforesaid band-pass filter 148 is connected at its input terminal to the receiving signal feeding line 151 and at its output terminal to a terminal connected to the band change-over control signal terminal 134 within the antenna unit 126. In this instance, when the change-over control reactance circuit within the antenna unit 126 employs a fixed reactance element, a latch (not shown) is provided to dispose the pulse signal for the band change-over signal fed between the terminal 153 and the band change-over control signal terminal 153, and when using a variable reactance element, the latch and digital-analog signal converter (not shown) are provided. The pulse signal for the band change-over control signal can be determined from the range of changing d.c. levels of the tuning control signal. In order to prevent the tuning control from being affected so as to be disturbed by the pulse signals, wave-detection output muting within the receiver 125 is allowed to work only when changing over the band.

In this instance, the receiver 125 in FIG. 35 may be of a closed loop synthesizer system utilizing PLL for a local oscillator performing the tuning control of receiver, of an open loop synthesizer system utilizing a D/A converter, or of a basically electronic tuning system using manual or automatic sweeping voltage control, the tuning control signal is enough to be fed into the tuning circuit at antenna unit 126.

As seen from the above, the antenna system of the invention, with respect to the receiver necessary to tune in a very wide range of frequency, exchanges no antenna element, changes no length thereof, and is tuned to each frequency, thereby constructing an antenna unit having a high working gain throughout the frequency band to be received, and thus providing the receiving device of very wide frequency range in cooperation with the receiver. Each time the band change-over signal from the receiver changes over reactance of change-over control reactance circuit at the antenna unit, the tuning control signal of tuning circuit is repeatedly supplied for use in a range of change, whereby the tuning circuit is simple in construction while the receiving device is very wide in its range of tuning frequencies, and variable reactance elements usual but not particular are usable so as to be very practicable. In particular, the FM stereo band, the VHF TV band, and the UHF TV band are receivable only by a receiving device comprising a set of an antenna unit and a receiver to thereby eliminate the inconvenience of receiving by separate antenna units and receivers for each band and also increase portions in common use, thus enabling the device to be very inexpensive to produce. More particularly, the use of the zigzag type contracted antenna elements can provide an antenna unit which is very small-sized and of high working gain to thereby provide a device which is extremely small-sized and of high efficiency.

FIGS. 40 through 43 are views of explanatory of the antenna unit of the present invention.

Figure 40:
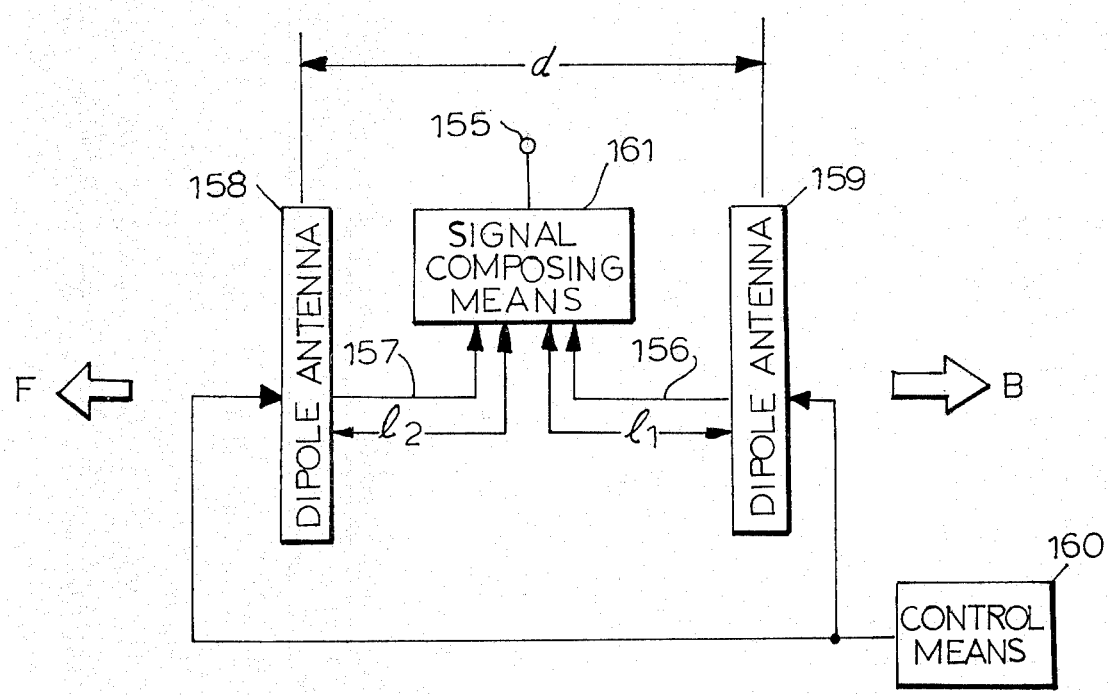
FIG. 40 is a view of the arrangement of an embodiment of a phase difference feeding type antenna system of the present invention.

FIG. 40 shows an embodiment of a phase difference feed type antenna device of the invention, in which reference numerals 158, 159 designate a first and a second dipole antenna opposite to each other at a regular distance, element 160 designates a control means in common with the first and second dipole antennas 158, 159, and element 161 designates a signal composing means connected to the first and second dipole antennas 158, 159. The second dipole antenna 159 is disposed at a phase difference of 180° with respect to the first dipole antenna, both the dipole antennas being coupled to the signal composing means 161 through coaxial cables 156, 157 each of different length, so that a signal is fed to a feed terminal 155 of signal composing means 161.

Now if the first dipole antenna 158 is disposed at the front F side and the second one 159 at the back B side and the lengths of coaxial cables 156, 157 are represented by $l_1$, $l_2$ respectively, a distance d between the opposite dipole antennas 158, 159 can be obtained by the following equation (1):

$$d = K(l_1 - l_2) \qquad (1)$$

where K: wave-length contraction ratio or velocity factor of 0.68 and $l_1 > l_2$.

Figure 41:
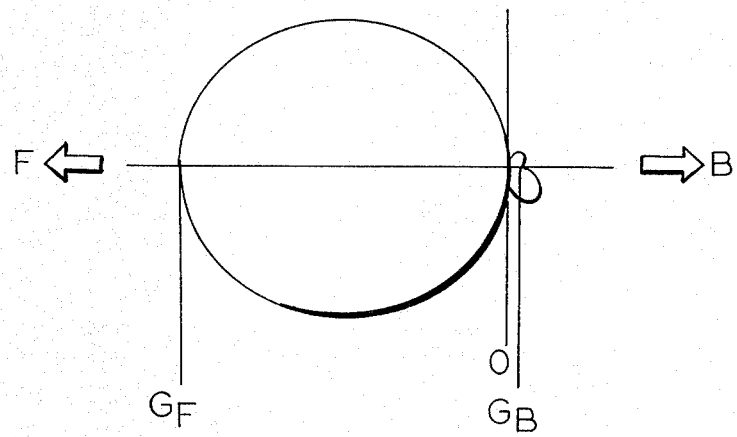
FIG. 41 is a view of the directional characteristic curve of the antenna system shown in FIG. 40.
Figure 42:
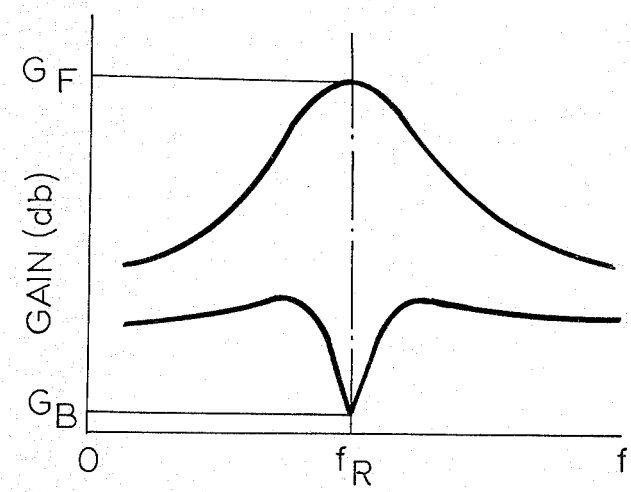
FIG. 42 is the characteristic curve of the frequency-gain parameters of the same antenna system.

The directivity of such a phase difference feed type antenna device is shown in FIG. 41 and the frequency to gain characteristic thereof in FIG. 42.

In addition, in the above embodiment, the first and second dipole antennas 158, 159 are disposed opposite to each other at a phase difference of 180°. Alternatively, both the dipole antennas 158, 159 may be disposed opposite in-phase so that the second dipole antenna may be connected to the signal composing means 161 by way of a phase converter 162.

FIGS. 43a through 47 are views explanatory of a modified embodiment of antenna unit of the present invention.

Figure 43:
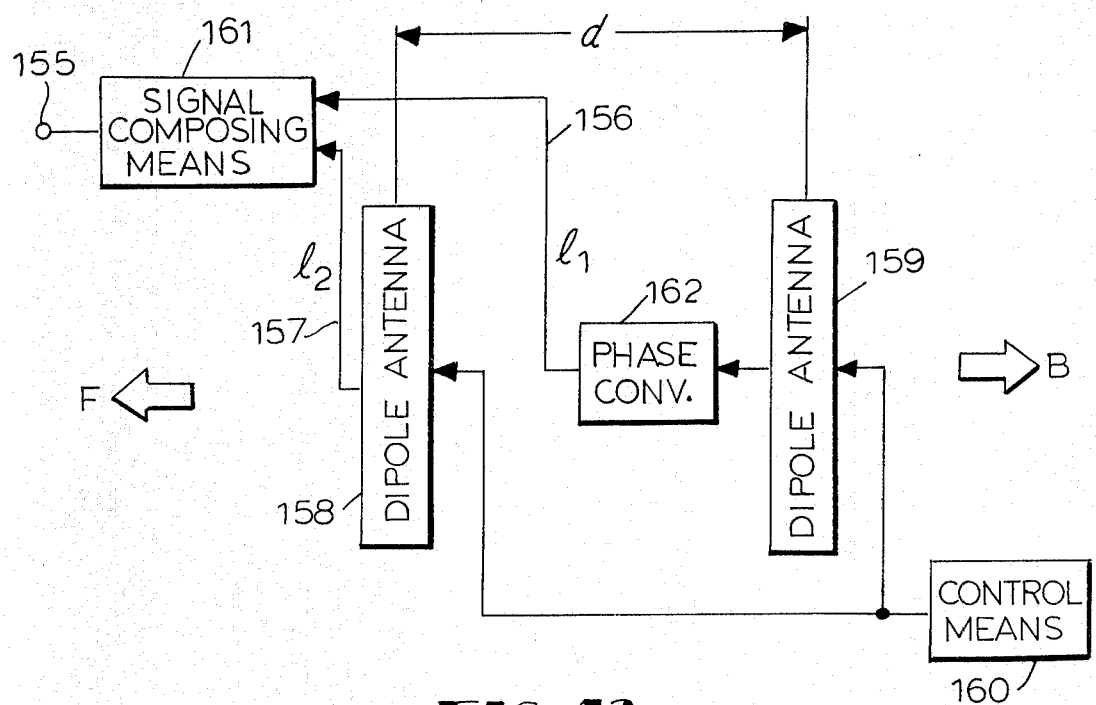
FIG. 43 and 43a are views showing the arrangement of a modified embodiment of the phase difference feeding type antenna system of the present invention.
Figure 43A:
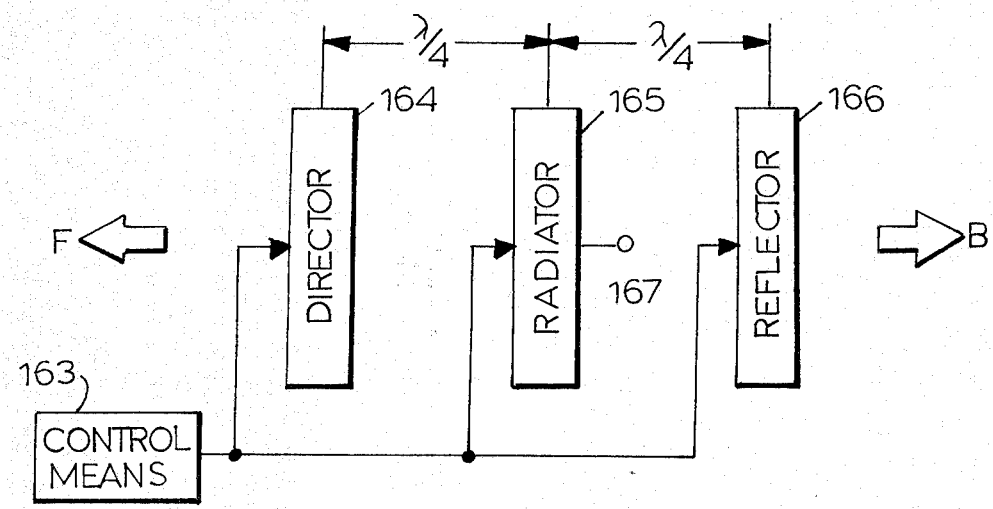

FIG. 43a shows the modified embodiment of an antenna device of the present invention, in which reference numerals 164, 165 and 166 designate first, second and third dipole antennas disposed opposite to each other at each interval of $\lambda/4$. The second dipole antenna is used as a radiator so as to have a feed terminal 167. The first dipole antenna 164 is disposed at the front F side of the second dipole antenna 165 used as the radiator and is in-phase with the antenna 165, thereby being used as a wave director. The third dipole antenna 166 is disposed at the back B side of second dipole antenna 165 used as the radiator and is in-phase with the dipole antenna 165, thereby being used as a reflector. Reference numeral 163 designates control means in common to the first, second and third dipole antennas used as the radiator, wave-director and reflector respectively.

Figure 44:
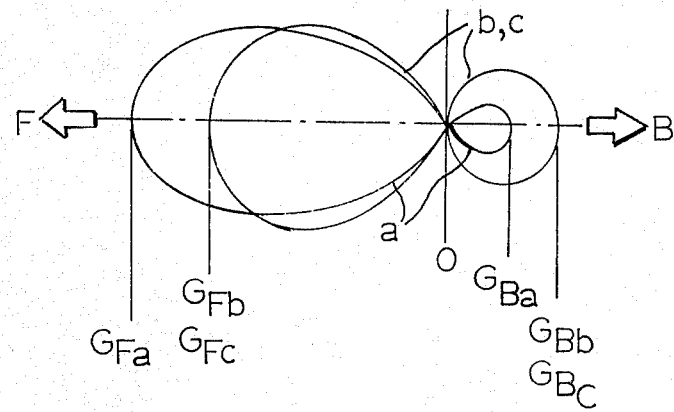
FIG. 44 is the directional characteristic curve of the antenna system shown in FIG. 43.
Figure 45:
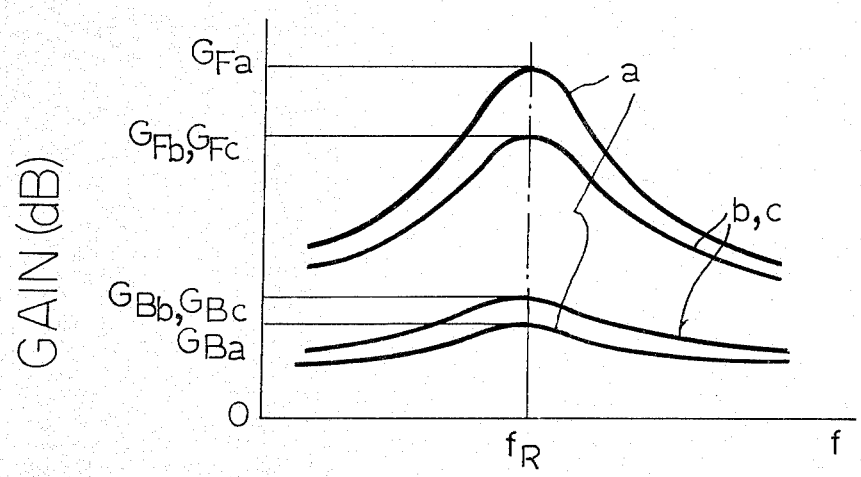
FIG. 45 is the electric field directional characteristic curve of the same antenna device.

The directivity characteristic of antenna device using such dipole antennas and having the wave-director and reflector is represented by the curve a in FIG. 44, and the frequency to gain characteristic by the curve a in FIG. 45.

Figure 46:
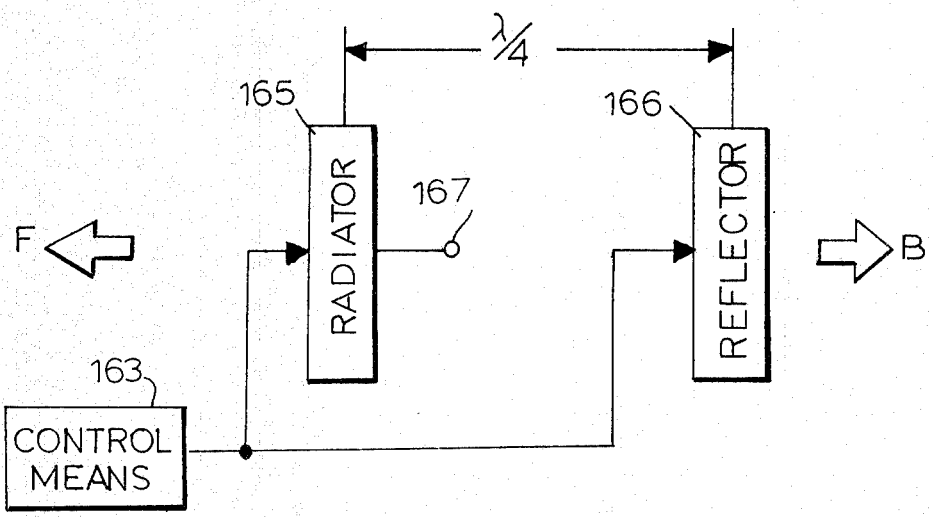
FIGS. 46 and 47 and 48 are views showing the arrangement of yet a further modified embodiment of the present invention.
Figure 47:
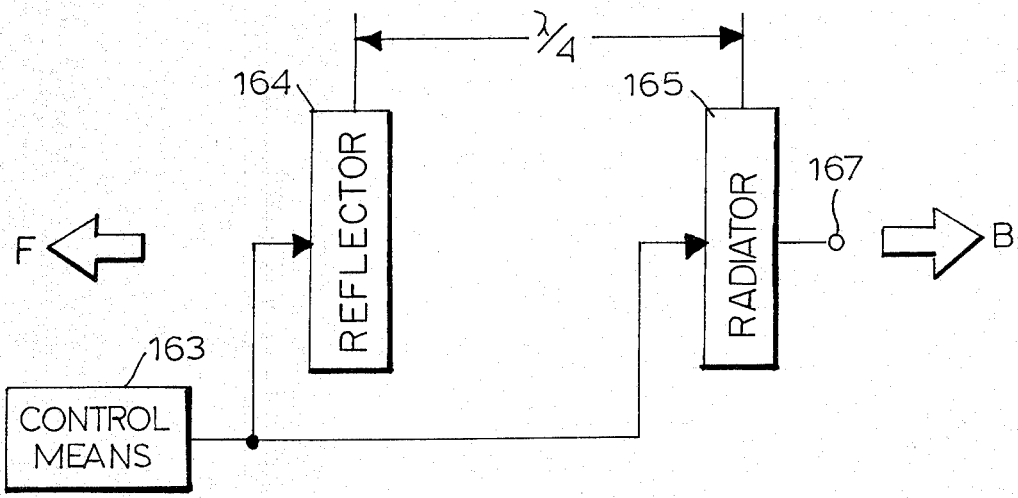
Figure 48:
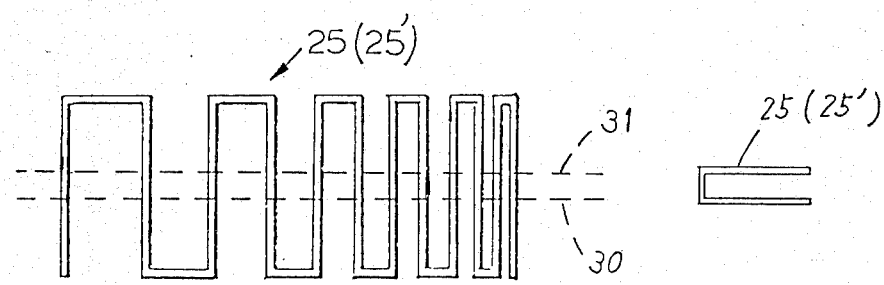

In addition, in the above embodiment, the wave director and reflector are attached to the front and rear of the radiator, but at least either wave director or reflector is enough to be attached as shown in FIGS. 46 and 47. The directivity and the frequency to gain characteristics are represented by the curves b, c in FIGS. 44 and 45.

What is claimed is:

1. An electronic tuning antenna system comprising a pair of antenna elements having a distributed constant inductance resulting from meandering transmitting conductor paths of said elements; variable reactance circuits connected to each of said pair of antenna elements and having variable capacity diodes; an antenna circuit having an impedance adjusting capacitor interconnected between feed terminals of said pair of antenna elements; and a receiver for regenerating a high-frequency received signal from said antenna circuit; wherein an output terminal of said antenna circuit and an input terminal of said receiver are connected by a high-frequency coaxial cable for transmitting said high-frequency received signal from said antenna circuit by way of said high-frequency coaxial cable to said receiver, and wherein a d.c. voltage having a correspondence to a tuning element of said receiver is applied as a bias voltage to said variable capacity diodes of said variable reactance circuits through said high-frequency coaxial cable.

2. An electronic tuning antenna system according to claim 1, wherein said antenna system further comprises control means for manually controlling the reactance of said two-terminal variable reactance circuits, whereby said antenna system is capable of optionally changing over tuning control of said antenna circuit into either manual control thereof or automatic control thereof.

3. An electronic tuning antenna system according to claim 1 or 2, wherein said antenna elements are arranged in a pattern having a continuous zigzag form which is close sequentially lengthwise of said elements.

4. An electronic tuning antenna system according to claim 3, wherein said antenna elements are bent along lines parallel to the longitudinal direction so that vertical conductors of said antenna elements are formed in a pattern having at least one turn-back.

* * * * *